United States Patent
Guan et al.

(10) Patent No.: US 12,411,194 B2
(45) Date of Patent: *Sep. 9, 2025

(54) RADIO FREQUENCY RECEIVING DEVICE

(71) Applicant: SHANGHAI UNITED IMAGING HEALTHCARE CO., LTD., Shanghai (CN)

(72) Inventors: Xiaolei Guan, Shanghai (CN); Jianfan Zhou, Shanghai (CN); Fangyan Hou, Shanghai (CN); Qiang Xie, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 1106 days.

This patent is subject to a terminal disclaimer.

(21) Appl. No.: 17/189,199

(22) Filed: Mar. 1, 2021

(65) Prior Publication Data
US 2021/0208221 A1    Jul. 8, 2021

Related U.S. Application Data

(63) Continuation of application No. 15/634,092, filed on Jun. 27, 2017, now Pat. No. 10,935,613, which is a
(Continued)

(51) Int. Cl.
*G01R 33/36* (2006.01)
*G01R 33/34* (2006.01)
(Continued)

(52) U.S. Cl.
CPC ......... *G01R 33/3607* (2013.01); *G01R 33/34* (2013.01); *G01R 33/3621* (2013.01);
(Continued)

(58) Field of Classification Search
CPC ............... G01R 33/3607; G01R 33/34; G01R 33/3621; G01R 33/3415; G01R 33/3678;
(Continued)

(56) References Cited

U.S. PATENT DOCUMENTS 5,160,891 A * 11/1992 Keren ................ G01R 33/3678
324/318
5,594,341 A * 1/1997 Majidi-Ahy ....... G01R 33/3621
324/318
(Continued)

FOREIGN PATENT DOCUMENTS

DE    102011006578 A1 * 10/2012 ......... G01R 33/3621
EP    2629433 A1    8/2013
(Continued)

OTHER PUBLICATIONS

English translation of DE102011006578A1 provided by Espacenet. 2024 (Year: 2024).*

(Continued)

*Primary Examiner* — Rishi R Patel
(74) *Attorney, Agent, or Firm* — METIS IP LLC

(57) ABSTRACT

A device for receiving RF signal is provided. The device includes a receiving component configured to receive a radio frequency (RF) signal and a sampling component configured to sample the RF signal. The sampling component may include a plurality of filters, a demultiplexer, a clock synthesizer, an analog-to-digital converter (ADC), and a digital signal processing device. The sampling component may obtain an intermediate frequency (IF) signal based on the plurality of filters, the demultiplexer, the clock synthesizer, the ADC, and the digital signal processing device.

20 Claims, 14 Drawing Sheets

Related U.S. Application Data continuation of application No. PCT/CN2017/072293, filed on Jan. 23, 2017.

(51) Int. Cl.
  *G01R 33/3415* (2006.01)
  *H03M 1/18* (2006.01)
(52) U.S. Cl.
  CPC .......... *H03M 1/188* (2013.01); *G01R 33/3415* (2013.01); *G01R 33/3678* (2013.01)
(58) Field of Classification Search
  CPC .......... G01R 33/3635; G01R 33/5608; H03M 1/188
  See application file for complete search history.

(56) References Cited

U.S. PATENT DOCUMENTS

| | | | |
|---|---|---|---|
| 5,739,691 A | 4/1998 | Hoenninger, III | |
| 6,297,637 B1* | 10/2001 | Feld | G01R 33/3621 324/322 |
| 7,508,212 B2 | 3/2009 | Fain et al. | |
| 8,035,384 B2 | 10/2011 | Saha | |
| 8,334,692 B2 | 12/2012 | Harvey et al. | |
| 8,587,315 B2 | 11/2013 | Kayano | |
| 9,606,204 B2 | 3/2017 | Qiu et al. | |
| 10,935,613 B2* | 3/2021 | Guan | G01R 33/3621 |
| 2007/0279061 A1* | 12/2007 | Erickson | G01R 33/5659 324/322 |
| 2008/0265890 A1 | 10/2008 | Graesslin et al. | |
| 2009/0096455 A1 | 4/2009 | Biber et al. | |
| 2010/0021032 A1* | 1/2010 | Boef | G01R 33/3621 382/131 |
| 2010/0054570 A1 | 3/2010 | Lamerichs et al. | |
| 2010/0148778 A1 | 6/2010 | Biber | |
| 2012/0183023 A1 | 7/2012 | Filipovic et al. | |
| 2015/0160313 A1 | 6/2015 | Jesmanowicz | |
| 2015/0355302 A1 | 12/2015 | Fischer et al. | |
| 2016/0274204 A1* | 9/2016 | Song | G01R 33/3607 |
| 2017/0164901 A1* | 6/2017 | Shusterman | A61B 5/0024 |

FOREIGN PATENT DOCUMENTS

| | | |
|---|---|---|
| WO | 2009095913 A1 | 8/2009 |
| WO | 2014201230 A1 | 12/2014 |

OTHER PUBLICATIONS

International Search Report in PCT/CN2017/072293 mailed on Oct. 27, 2017, 4 pages.
The Partial Supplementary European Search Report in European Application No. 17801321.5 mailed on Nov. 27, 2018, 16 pages.
Carl A. Michal et al., A high performance digital receiver for home-built nuclear magnetic resonance spectrometers, Review of Scientific Instruments, 73(2): 453-458, 2002.
"Receiver Technology", Web Page <http://www.mr.ethz.ch/parallelmri04/abstracts/pub/Duyn.pdf>, retrieved on Aug. 20, 2007.
The Extended European Search Report in European Application No. 23202622.9 mailed on Jan. 29, 2024, 8 pages.

* cited by examiner

RADIO FREQUENCY RECEIVING DEVICE

CROSS-REFERENCE TO RELATED APPLICATIONS

This application is a continuation of U.S. patent application Ser. No. 15/634,092, filed on Jun. 27, 2017, which claims priority to International Application No. PCT/CN2017/072293 filed on Jan. 23, 2017, the entire content of which is hereby incorporated by reference.

TECHNICAL FIELD

The present disclosure generally relates to radio frequency (RF) receiving device, and more particularly to a device for receiving or sampling RF signals from multiple nuclei in magnetic resonance imaging (MRI).

BACKGROUND

Magnetic resonance imaging (MRI) is a medical diagnostic technology that has been widely used for inspecting a patient body. Traditional MRI system generates a magnetic resonance (MR) image based on hydrogen nuclei. However, in recent years MR spectroscopic studies using multiple species of nuclei such as $^3$He, $^7$Li, $^{13}$C, $^{17}$O, $^{19}$F, $^{23}$Na, $^{31}$P, $^{129}$Xe, etc., is getting more and more attention. Accordingly, a device for sampling MR signals from multiple nuclei is in demand.

SUMMARY

In a first aspect of the present disclosure, a device for receiving an RF signal is provided. The device may include a receiving component configured to receive a radio frequency (RF) signal and a sampling component configured to sample the RF signal. The RF signal may have a center frequency and a bandwidth. The sampling component may include: a plurality of filters configured to filter the RF signal, a demultiplexer, a clock synthesizer, an analog-to-digital converter (ADC), and a digital signal processing device. Each of the plurality of filters may have a pass band. The demultiplexer may be connected between the receiving component and the plurality of filters. The demultiplexer may transmit, based on the center frequency and bandwidth of the RF signal and the pass band of the one filter of the plurality of filters, the RF signal to one filter of the plurality of filters, the pass band of the one filter including the center frequency and the bandwidth of the RF signal. The clock synthesizer may generate a first clock signal. The analog-to-digital converter (ADC) may sample the RF signal filtered by the plurality of filters based on the first clock signal, and convert the sampled RF signal into a digital signal. The digital signal processing device may be connected to the ADC. The digital signal processing device may perform in-phase/quadrature (I/Q) demodulation on the digital signal to obtain an intermediate frequency (IF) signal based on the first clock signal.

In some embodiments, the RF signal may originate from hydrogen nuclei or non-hydrogen nuclei in an imaged subject by magnetic resonance imaging (MRI).

In some embodiments, the receiving component may further include a first filter configured to filter the RF signal, and a first amplifier configured to amplify the RF signal. The first filter may include at least one of a band pass filter (BPF). In some embodiments, the BPF may include an inductor capacitor filter (LC filter) or a surface acoustic wave filter (SAW filter).

In some embodiments, the sampling component may further include a second amplifier. The second amplifier may be located or connected between the receiving component and the demultiplexer. The second amplifier may amplify the RF signal.

In some embodiments, the number of the plurality of filters may correlate with or correspond to the additive white noise introduced by the second amplifier.

In some embodiments, the plurality of filters may be configured as AAFs.

In some embodiments, the clock synthesizer may receive a second clock signal from a clock outside of the device.

In some embodiments, the clock synthesizer may include a phase-locked loop (PLL) for generating the first clock signal based on the second.

In some embodiments, the I/Q demodulation may be performed according to the first clock signal.

In some embodiments, an image or a spectrum may be generated based on the IF signal.

In some embodiments, generating the image or the spectrum based on the IF signal may further include generating k-space data based on the IF signal.

In some embodiments, the digital signal processing device may include a first channel configured to process a first digital signal to obtain a first intermediate frequency (IF) signal with a first bit-width; and a second channel configured to divide a second digital signal to obtain a third signal with a third bit-width and a fourth signal with a fourth bit-width and combine the third signal with the fourth signal to obtain a second IF signal with the first bit-width.

In a second aspect of the present disclosure, a digital signal processing device is provided. The digital signal processing device may include a first channel and a second channel. The first channel may process a first signal to obtain a first intermediate frequency (IF) signal with a first bit-width. The second channel may divide a second signal to obtain a third signal with a third bit-width and a fourth signal with a fourth bit-width; and combine the third signal with the fourth signal to obtain a second IF signal with the first bit-width.

In some embodiments, the first signal originates from hydrogen nuclei in an imaged subject by MRI.

In some embodiments, the second signal originates from non-hydrogen nuclei in the same imaged subject by MRI.

In some embodiments, the digital signal processing device may further include a band pass decimation filter configured to process the first signal to obtain a first IF signal.

In some embodiments, I/Q demodulation may be employed to divide the second signal into the third signal and the fourth signal.

In some embodiments, the digital signal processing device may further include a low pass decimation filter configured to perform the I/Q demodulation.

In some embodiments, the first bit-width may be extended from a fifth bit-width by adding one or more zeros after the least significant bit (LSB) of the first IF signal, or adding one or more signs before the most significant bit (MSB) of the first IF signal.

In some embodiments, each of the third bit-width and the fourth bit-width may equal to a half of the fifth bit-width.

In some embodiments, an image or a spectrum may be generated based on the first IF signal or the second IF signal.

In some embodiments, generating the image or the spectrum based on the first IF signal or the second IF signal may further include generating k-space data based on the first IF signal or the second IF signal.

In a third aspect of the present disclosure, a method for receiving and sampling digital signals is provided. The method may include receiving a FID signal; determining that the FID signal is a first signal originating from a first species of nuclei; in response to the determination that the FID signal is the first signal, processing the first signal originating from a subject to obtain a first IF signal with a first bit-width; determining that the FID signal is a second signal originating from a second species of nuclei; and in response to the determination that the FID signal is the second signal, dividing the second signal originating from the subject to obtain a third signal with a third bit-width and a fourth signal with a fourth bit-width; and combining the third signal with the fourth signal to obtain a second IF signal with the first bit-width.

In some embodiments, the processing the first signal comprising extending the first signal from a fifth bit-width to the first bit-width.

In some embodiments, the method may further include generating k-space data based on the first IF signal or the second IF signal.

In some embodiments, the method may further include generating an image based on the k-space data.

In some embodiments, the method may further include determining a spectrum of the frequencies of the FID signal.

In a fourth aspect of the present disclosure, a method for receiving and sampling digital signals is provided. The method may include receiving an RF signal, the RF signal having a center frequency and a bandwidth; and sampling the RF signal, the sampling the RF signal may include selecting, based on the center frequency and the bandwidth of the RF signal, a filter from a plurality of filters, the pass band of the filter including the center frequency and the bandwidth of the RF signal; filtering the RF signal using the selected filter; acquiring a first clock signal, sampling the filtered RF signal based on the first clock signal; converting the sampled RF signal into a digital signal; and processing the digital signal to obtain an IF signal based on the first clock signal.

In some embodiments, the processing the digital signal to obtain an IF signal based on the first clock signal may include determining that the digital signal is a first signal originating from a first species of nuclei; in response to the determination that the digital signal is the first signal, processing the first signal originating from a subject to obtain the IF signal with a first bit-width; determining that the digital signal is a second signal originating from a second species of nuclei; and in response to the determination that the digital signal is the second signal, dividing the second signal originating from the subject to obtain a third signal with a third bit-width and a fourth signal with a fourth bit-width; and combining the third signal with the fourth signal to obtain the IF signal with the first bit-width.

In some embodiments, the processing the first signal may include extending the first signal from a fifth bit-width to the first bit-width.

In some embodiments, the method may further include generating k-space data based on the IF signal.

In some embodiments, the method may further include generating an image based on the k-space data.

In some embodiments, the method may further include determining a spectrum of the frequencies of the RF signal.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirits and scope of the present disclosure. Thus, the present disclosure is not limited to the embodiments shown, but to be accorded the widest scope consistent with the claims.

It will be understood that the term "system," "unit," "module," and/or "block" used herein are one method to distinguish different components, elements, parts, section or assembly of different level in ascending order. However, the terms may be displaced by other expression if they may achieve the same purpose.

It will be understood that when a unit, module or block is referred to as being "on," "connected to," or "coupled to" another unit, module, or block, it may be directly on, connected or coupled to the other unit, module, or block, or intervening unit, module, or block may be present, unless the context clearly indicates otherwise. It will be understood that the connection or coupling between units, modules, or blocks is operable. As used herein, the term "and/or" includes any and all combinations of one or more of the associated listed items.

The terminology used herein is for the purposes of describing particular examples and embodiments only, and is not intended to be limiting. As used herein, the singular forms "a," "an," and "the" may be intended to include the plural forms as well, unless the context clearly indicates otherwise. It will be further understood that the terms "include," and/or "comprise," when used in this disclosure, specify the presence of integers, devices, behaviors, stated features, steps, elements, operations, and/or components, but do not exclude the presence or addition of one or more other integers, devices, behaviors, features, steps, elements, operations, components, and/or groups thereof.

Figure 1:
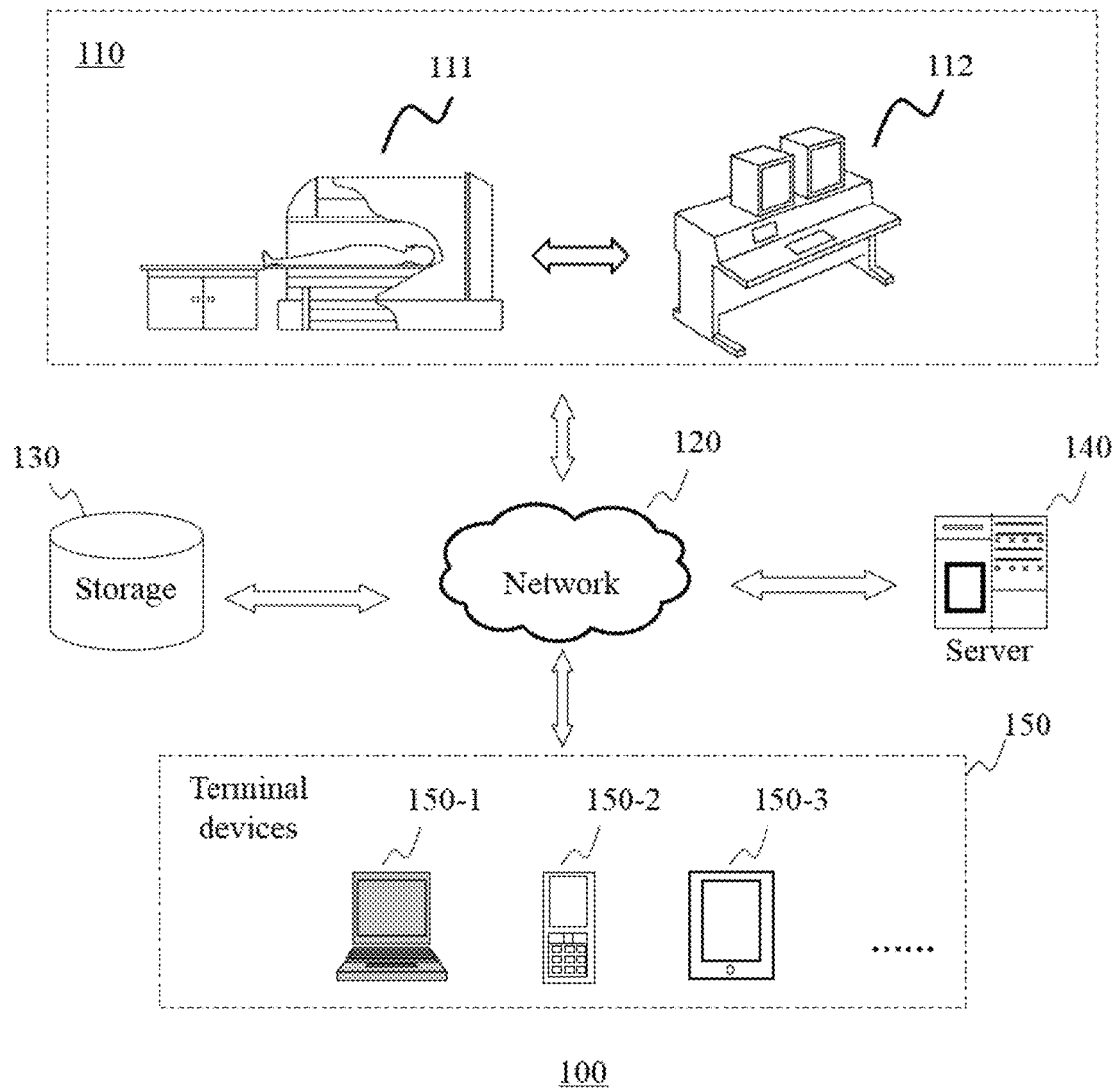
FIG. 1 is a schematic diagram illustrating an exemplary networked environment 100 including an image system 110 according to some embodiments of the present disclosure.

FIG. 1 is a schematic diagram illustrating an exemplary networked environment 100 including an imaging system 110 according to some embodiments of the present disclosure. In some embodiments, imaging system 110 may be a magnetic resonance imaging (MRI) system. The present disclosure may be implemented on any suitable systems or devices containing a receiver for sampling RF signals of multiple frequencies, for example, an astronomical observation system, a petroleum or natural gas exploration system, etc.

As illustrated in FIG. 1, imaging system 110 may include an MRI scanner 111 and a computing device 112. MRI scanner 111 may perform an MR scan on a subject, and acquire magnetic resonance (MR) signals based on the scan. The scanned subject may be a patient, an animal, a non-living sample, or the like. In some embodiments, MRI scanner 111 may perform the scan by applying a radio frequency (RF) pulse to the imaged subject (for example, a patient). When the frequency of the RF pulse equals to the Larmor frequency of certain nuclei, an MR signal may originate from the subject. As used herein, the Larmor frequency may refer to the frequency at which a nucleus spins. According to the intrinsic quantum property, different species of nuclei may spin at different frequencies. Exemplary species of nuclei may include hydrogen nuclei ($^1$H), or non-hydrogen nuclei (such as $^3$He, $^7$Li, $^{13}$C, $^{17}$O, $^{19}$F, $^{23}$Na, $^{31}$P, $^{129}$Xe, etc.). As used herein, non-hydrogen nuclei may refer to one or more species of nuclei other than hydrogen nuclei. In some embodiments, the MR signal originating from the subject may include an RF signal. MRI scanner 111 may receive the RF signal by, for example, a coil element. The received RF signal may cause MRI scanner 111 to generate an intermediate frequency (IF) signal. The operation may include noise elimination, analog-to-digital conversion, sampling rate reduction, or the like.

In some embodiments, imaging system 110 may be a single-modality system. For instance, imaging system 110 may include MRI scanner 111. In some embodiments, imaging system 110 may be a multi-modality system including, e.g., a positron emission tomography-magnetic resonance imaging (PET-MRI) scanner, a single photon emission computed tomography-magnetic resonance imaging (SPECT-MRI) scanner, etc.

Computing device 112 may receive the IF signal from MRI scanner 111 to reconstruct an image. In some embodiments, computing device 112 may process the IF signal before image reconstruction. For instance, k-space data may be generated based on the IF signal before image reconstruction. In some embodiments, computing device 112 may include an operation console. Via the operation console, a user may control MRI scanner 111 to perform an MR scan. In some embodiments, computing device 112 may process other information. For example, computing device 112 may execute instructions for image reconstruction or signal processing that may relate to routines, programs, procedures, data structures, etc.

Computing device 112 may include a computer, a server, etc. In some embodiments, computing device 112 may be any of these devices that include suitable components such as a processor (for example, a microprocessor, a digital signal processor, a controller, etc.), a memory, a communication port, an input/output (for example, a touch screen), etc.

Imaging system 110 be may be connected to a network 120. Network 120 may be a wireless network (e.g., Bluetooth, WLAN, Wi-Fi, WiMax, etc.), a mobile network (e.g., 2G, 3G, 4G signals, etc.), a virtual private network (VPN), a shared network, a near field communication (NFC), ZigBee, a telephone network, a metropolitan area network, a public switched telephone network (PSTN), etc. It should be noted that other known communication networks or methods which provide a medium for transmitting data between separate devices are also contemplated. Via network 120, imaging system 110 may connect to a storage 130, a server 140, and one or more terminal devices 150 through a wired connection or a wireless connection, or a combination of both. In some embodiments, computing device 112 may connect to MRI scanner 111 via network 120.

Storage 130 may store an image and/or other relevant information of imaging system 110. For example, the stored information may include health history information of a patient, images of a patent's organ, scanning parameters of the MRI scanner, image processing techniques used by, for example, computing device 112, etc. In some embodiments, storage 130 may be a database. The database may include a hierarchical database, a network database, a relational database, or the like, or a combination thereof. In some embodiments, the storage may be implemented by a device for storing information, such as a random access memory (RAM), a CD-ROM, a flash memory, a hard disk, a read only memory (ROM), or the like, or a combination thereof.

Server 140 may have storage capacities and/or computation capacities. Server 140 may store MRI images and/or other relevant information of the imaging system 110, and/or process the stored information. Server 140 may be of various types. For example, server 140 may be an application server, a catalog server, a computing server, a file server, media server, etc. In some embodiments, server 140 may be a file server configured to store the MR images. In some embodiment, server 140 may be a computing server configured to process the MR images. For example, server 140 may reconstruct an image based on the data acquired from the MRI scanner 111. As another example, server 140 may render the reconstructed image and send it to the computing device 112 or terminal devices 150, via network 120. Server 140 may be centralized or distributed. Server 140 may be a local one or a remote one. Merely by way of example, server 140 may include a cloud server.

Terminal devices 150 may communicate with imaging system 110, storage 130, and/or server 140 via network 120. Terminal device 150 may include a laptop 150-1, a mobile phone 150-2, a tablet computer 150-3, a wearable device (not shown in the figure), etc. In some embodiments, terminal devices 150 may be used, by a user (for example, a patient, a doctor, an imaging specialist), to acquire MR images from imaging system 110, storage 130, or server 140. In some embodiments, a user may input control information via terminal devices 150 to control the operation of imaging system 110. For example, a user may input designated control information via the terminal devices 150 to control the scanning process, data storage, and/or image processing of imaging system 110. The input information received by imaging system 110 may be transmitted to the computing device 112 for further processing.

It should be noted that the above description of imaging system 110 is merely provided for the purposes of illustration, and not intended to limit the scope of the present disclosure. For persons having ordinary skills in the art, multiple variations and modifications may be made under the teachings of the present disclosure. For example, the assembly and/or function of imaging system 110 may be varied or changed according to specific implementation scenarios. For example, storage 130 may be part of server 140. However, those variations and modifications do not depart from the scope of the present disclosure.

Figure 2:
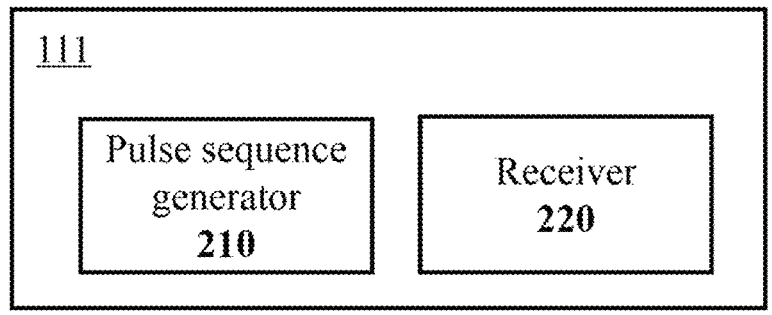
FIG. 2 is a schematic diagram illustrating an exemplary MRI scanner according to some embodiments of the present disclosure.

FIG. 2 is a schematic diagram illustrating an exemplary MRI scanner according to some embodiments of the present disclosure. MRI scanner 111 may include a pulse sequence generator 210 and a receiver 220. Pulse sequence generator 210 may generate a pulse sequence for scanning a subject (for example, a patient). Exemplary pulse sequence may include spin echo (SE) sequence, fast spin echo (FSE) sequence, ultrashort echo-time (UTE) sequence, gradient echo (GRE) sequence, etc.

Pulse sequence generator 210 may generate an electromagnetic pulse. In some embodiments, the electromagnetic pulse may be an RF pulse. In some embodiments, the RF pulse may be of a certain frequency. If the frequency of the RF pulse equals to the Larmor frequency of one or more nuclei, resonance may be achieved. In some embodiments, an MR signal may originate from the patient based on the resonance. In some embodiments, the MR signal may be induced from hydrogen nuclei. In some embodiments, the MR signal may be induced from non-hydrogen nuclei.

A gradient magnetic field in different directions may be driven by gradient waveform generated by pulse sequence generator 210. The gradient magnetic field may be used to encode the MR signal. In some embodiment, the MR signal may be encoded in a three-dimensional manner, for example, in an x direction, a y direction, and a z direction. The x direction, the y direction, and the z direction may be defined by imaging system 110 or a user.

Receiver 220 may receive an MR signal. In some embodiments, the MR signal may be an RF signal. In some embodiments, the RF signal may also be referred to as free induction decay (FID) signal. Receiver 220 may acquire the MR signal induced in, for example, a receiver coil. In some embodiments, receiver 220 may receive the MR signal from a specific part of the patient body, for example, the head, the arms, the carotid artery, the spine, etc. The MR signal originating from a part of the patient body may be induced in the receiver coil. The receiver coil may be a quadrature coil, a surface coil, a special coil, or the like, or any combination thereof. When the MR signal is received, a current signal or a voltage signal may be induced in the receiver coil accordingly.

Receiver 220 may also sample the received MR signal. Various sampling techniques may be applied for sampling the MR signal. Exemplary sampling techniques may include simple random sampling, stratified sampling, probability-proportional-to-size sampling, accidental sampling, cluster sampling, or the like, or any combination thereof. In some embodiments, one or more signal processing techniques may be applied during the sampling process. Exemplary signal processing techniques may include time-frequency analysis, differential equations, spectral estimation, a linear time-invariant system theory, a transform theory, or the like, or any combination thereof. In some embodiments, the sampling and/or signal processing techniques may be performed by one or more electronic devices or components. Merely by ways of example, the devices may include filters, analog-to-digital convertors (ADCs), signal compressors, digital signal processors (DSPs), amplifiers, or the like. In some embodiments, receiver 220 may further include other devices (for example, a clock synthesizer, a demultiplexer, a multiplexer, etc.) that may facilitate the MR signal sampling. In some embodiments, an IF signal may be generated by receiver 220 based on the received RF signal.

It should be noted that the above description of MRI scanner 111 is merely provided for the purposes of illustration, and not intended to limit the scope of the present disclosure. For persons having ordinary skills in the art, multiple variations and modifications may be made under the teachings of the present disclosure. For example, MRI scanner 111 may further include some other components, such as a patient positioning bed, a scanner driving device, etc. However, those variations and modifications do not depart from the scope of the present disclosure.

Figure 3A:
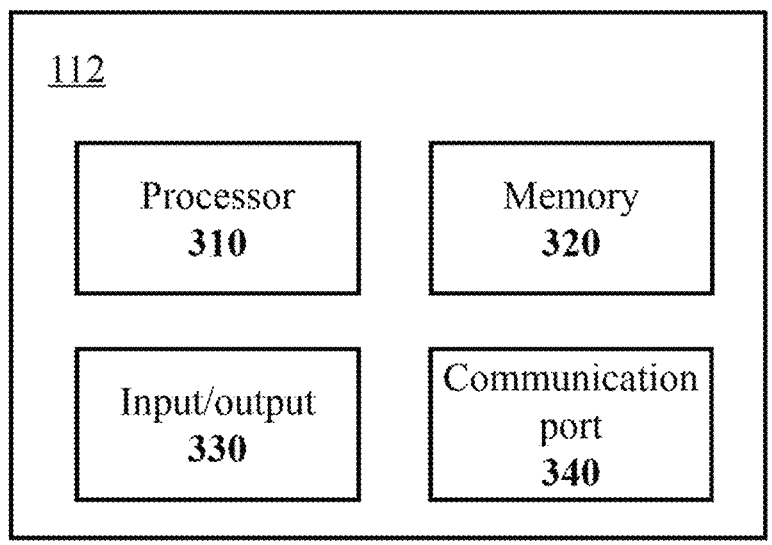
FIG. 3A is a schematic diagram illustrating an exemplary computing device according to some embodiments of the present disclosure.

FIG. 3A is a schematic diagram illustrating an exemplary computing device according to some embodiments of the present disclosure. Computing device 112 may include a processor 310, a memory 320, an input/output 330 and a communication port 340.

Processor 310 may process received information. Process 310 may process information received from MRI scanner 111, storage 130, server 140, or terminal devices 150. In some embodiments, processor 310 may process information received from memory 320, input/output 330. The information may include MR signals, MR images, pulse sequences, instructions from a user, or the like, or any combination thereof. In some embodiments, processor 310 may process the MR signals received from MRI scanner 111 to reconstruct an image. Various operations may be performed by processor 310 to reconstruct an image. For example, the operations may include linear fitting, least squares operation, 2D Fourier transform (2D FT), Z-transform, Laplace transform, principle component analysis (PCA), nearest neighbor interpolation, regridding, iteration, or the like, or any combination thereof. In some embodiments, processor 310 may execute computer instructions. The computer instructions may relate to routines, programs, procedures, data structures, etc.

Processor 310 may be a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, an advanced RISC machine (ARM), a programmable logic device (PLD), any circuit or processor capable of executing one or more functions, or the like, or any combinations thereof. In some embodiments, processor 310 may be a specially designed processor. For example, processor 310 may be a processor designed in according with the digital imaging and communications in medicine (DICOM) protocol.

Memory 320 may store the images or other information relating to imaging system 110. Memory 320 may store information received from MRI scanner 111, processor 310, input/output 330, or other devices connected to the imaging system 110 via network 120. The information stored in memory 320 may include programs, software, algorithms, data, text, number, images, or the like, or a combination thereof. Exemplary algorithms may include recursion, a bisection algorithm, a divide and conquer algorithm, a dynamic programming technique, an iterative algorithm, a branch-and-bound algorithm, a backtracking algorithm, the Otsu's algorithm, a fuzzy set algorithm, a two-dimensional entropy thresholding algorithm, the fuzzy C-means (FCM) clustering algorithm, or the like, or any combination thereof. These examples are provided here for illustration purposes, and not intended to limit the scope of the present disclosure. In some embodiments, memory 320 may share information with storage 130 and/or server 140 via network 120.

Memory 320 may be a local device or a remote device (e.g., a cloud storage). Merely by ways of example, memory 320 may be a random access memory (RAM), a read only memory (ROM), a flash memory, a nano random access memory, a hard disk, a floppy disk, a compact disk (CD), or any other devices suitable for storing data.

Input/output 330 may provide an interface to communicate with a user. In some embodiments, input/output 330 may receive input from the user. For example, input/output 330 may receive instructions or parameters regarding to the operation of MRI scanner 111 from a user. The received input from the user through input/output 330 may be transmitted to processor 310 for further processing. In some embodiments, input/output 330 may send information to a user. For example, input/output 330 may send medical history information, or an MR image to a user. Input/output 330 may include an interface including a display, a keyboard, a mouse, a touch screen, a microphone, a sensor, a wireless communication unit or the like, or any combination thereof. In some embodiments, input/output 330 may be implemented on a control console of computing device 112.

In some embodiments, input/output 330 may support input/output flows between computing device 112 and other components therein, such as a user interface (e.g., a portable computer).

Communication port 340 may be connected to a network to facilitate data communications. Communication port 340 may establish connections between computing device 112, MRI scanner 111 and network 120. The connection may be a wired connection, or a wireless connection, or combination of both that enables data transmission and reception. Wired connection may include electrical cable, optical cable, telephone wire, or the like, or any combination thereof. Wireless connection may include Bluetooth, Wi-Fi, WiMax, WLAN, ZigBee, mobile network (e.g., 3G, 4G, 5G, etc.), or other wireless connections. In some embodiments, communication port 340 may be a standardized communication port, such as RS232, RS485, etc. In some embodiments, communication port 340 may be a specially designed communication port. For example, communication port 340 may be designed in accordance with the digital imaging and communications in medicine (DICOM) protocol.

It should be noted that the above description of computing device 112 is merely provided for the purposes of illustration, and not intended to limit the scope of the present disclosure. For persons having ordinary skills in the art, multiple variations and modifications may be made under the teachings of the present disclosure. For example, exemplary computer platform may include an internal communication bus, program storage and data storage of different forms, e.g., a disk, a read only memory (ROM), a or random access memory (RAM), for various data files to be processed and/or communicated by the computer, as well as possibly program instructions to be executed by the CPU. However, those variations and modifications do not depart from the scope of the present disclosure.

Figure 3B:
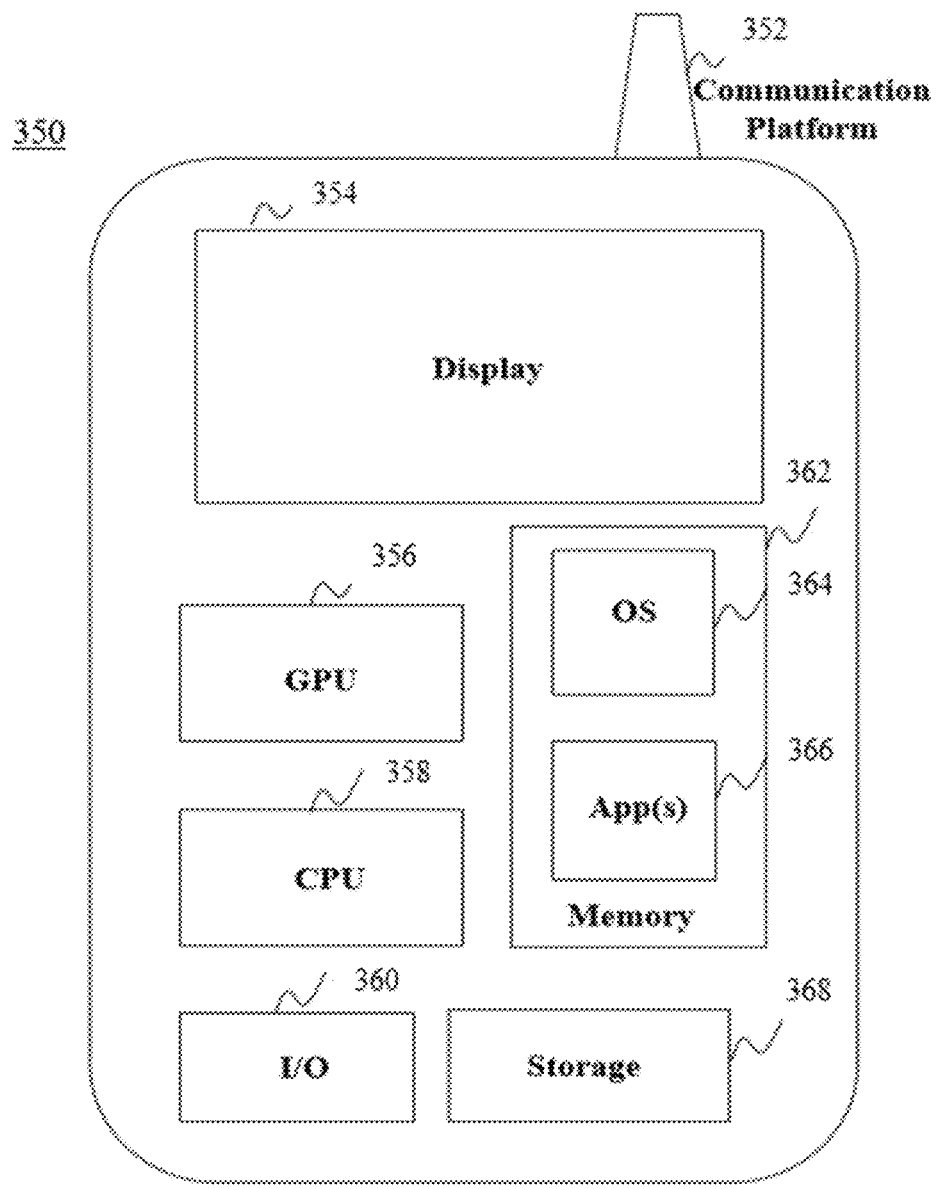
FIG. 3B illustrates the architecture of a mobile device which may be used to realize a specialized system implementing the present disclosure.

FIG. 3B illustrates the architecture of a mobile device that may be used to realize a specialized system implementing the present disclosure. In some embodiments, a mobile device 350 as illustrated in FIG. 3B may constitute a terminal device 150. For instance, a user may receive or provide information, imaging system 110, or otherwise interact with imaging system 110, using mobile device 350. Mobile device 350 may include a smart phone, a tablet, a handled console, and a wearable computing device (e.g., eyeglasses, wrist watch, etc.), or in any other form factor. In some embodiments, mobile device 350 may include one or more central processing units (CPUs) 358, one or more graphic processing units (GPUs) 356, a display 354, a memory 362, a communication platform 352, such as a wireless communication module, storage 368, and one or more input/output (I/O) devices 360. Any other suitable components including, for example, o a system bus or a controller (not shown), may also be included in mobile device 350. As shown in FIG. 3B, a mobile operating system 364, e.g., iOS, Android, Windows Phone, etc., and one or more applications 366 may be loaded into the memory 362 from the storage 368 in order to be executed by the CPU 358. The applications 366 may include a browser or any other suitable mobile apps for receiving and rendering information relating to information from or to imaging system 110 on mobile device 350. User interactions with the information stream may be achieved via the I/O devices 360 and provided to imaging system 110 and/or other components of the system, e.g., via network 120.

To implement various modules, units, and their functionalities described in the present disclosure, computer hardware platforms may be used as the hardware platform(s) for one or more of the elements described herein (e.g., the imaging system 110, and/or other components of the system described with respect to FIG. 1 through FIG. 16). The hardware elements, operating systems and programming languages of such computers are conventional in nature, and it is presumed that those skilled in the art are adequately familiar therewith to adapt those technologies to the imaging processing or signal processing as described herein. A computer with user interface elements may be used to implement a personal computer (PC) or other type of work station or terminal device, although a computer may also act as a server if appropriately programmed. It is believed that those skilled in the art are familiar with the structure, programming and general operation of such computer equipment and as a result the drawings should be self-explanatory.

Figure 4:
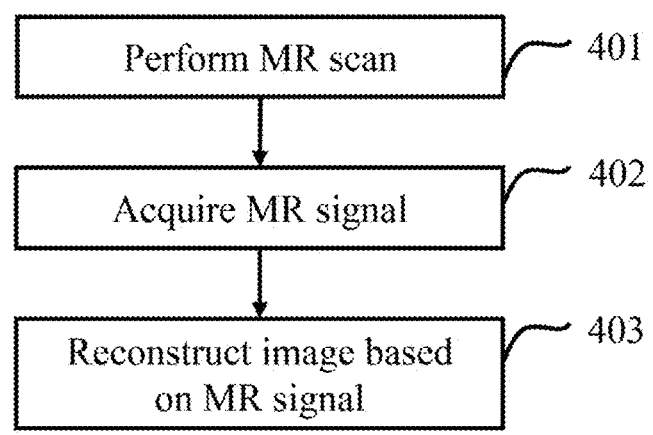
FIG. 4 is a flowchart of an exemplary process for generating an image according to some embodiments of the present disclosure.

FIG. 4 is a flowchart of an exemplary process for generating an MR image according to some embodiments of the present disclosure. In 401, an MR scan may be performed. The MR scan may be performed by, for example, MRI scanner 111. In some embodiments, one or more parameters may be sent to MRI scanner 111 before or during the MR scan. The parameters may include a region of interest (ROI), slice thickness, an imaging type (e.g., T1 weighted imaging, T2 weighted imaging, proton density weighted imaging, etc.), a flip angle value, acquisition time (TA), echo time (TE), repetition time (TR), echo train length (ETL), the number of phases, the number of excitations (NEX), inversion time, bandwidth (e.g., RF receiver bandwidth, RF transmitter bandwidth, etc.), or the like, or any combination thereof.

In some embodiments, a pulse sequence may be sent to the MRI scannerilI as a parameter. Exemplary pulse sequence may include spin echo, fast spin echo (FSE), fast recovery FSE, single shot FSE, gradient recalled echo, fast imaging with stead-state procession, etc. The pulse sequence may be generated by, for example, pulse sequence generator 210. The pulse sequence may include pulses of an excitation radio frequency (RF) motivating a resonance in the MR scan. In some embodiments, the frequency of the RF pulse may be set based on the Larmor frequency of a certain nucleus (for example, $^{1}H$, $^{3}He$, $^{7}Li$, $^{13}C$, $^{17}O$, $^{19}F$, $^{23}Na$, $^{31}P$, $^{129}Xe$, etc.). In some embodiments, a patient, or a portion thereof (e.g., tissues or organs of the patient including, e.g., head, heart, lung, blood vessel, muscle, etc.) may be scanned by MR scanner 111.

In 402, an MR signal may be acquired. The MR signal may be an RF signal.

In some embodiments, the RF signal may also be referred to as FID signal. In some embodiments, the signal acquisition may be performed by, for example, receiver 220. One or more coil elements may be used to receive the MR signal. In some embodiments, the one or more coil elements may receive an MR signal of a specific frequency or a narrow bandwidth that corresponds to a single nucleus species. In some embodiments, the one or more coil elements may receive an MR signal of a wide bandwidth that corresponds to multiple nuclei (for example, $^{3}He$, $^{7}Li$, $^{13}C$, etc.). In some embodiments, an analog signal (for example, a voltage signal or a current signal) may be induced in the one or more coil elements in response to the received MR signal.

In some embodiments, various sampling techniques may be applied while sampling the MR signal. Exemplary sampling techniques may include simple random sampling, stratified sampling, accidental sampling, cluster sampling, or the like, or any combination thereof. In some embodiments, one or more signal processing techniques may be applied during the sampling process. Exemplary signal processing techniques may include time-frequency analysis, differential equations, spectral estimation, a linear time-invariant system theory, a transform theory, or the like, or any combination thereof. In some embodiments, the one or more signal processing techniques may be performed by one or more electronic devices or components. Merely by ways of example, the devices may include filters, ADCs, signal compressors, digital signal processors (DSPs), amplifier, or the like. In some embodiments, after the sampling and processing, an IF signal may be generated and sent to computing device 112 for further processing or image reconstruction.

In 403, an image may be reconstructed based on the MR signal. Various image reconstruction techniques may be applied to reconstruct an image based on the acquired MR signal. Merely by way of example, the reconstruction technique may include linear fitting, Fourier transform (FT), fast Fourier transform (FFT), non-uniform fast Fourier transform (NUFFT), interpolation, or the like, or any combination thereof. In some embodiments, the acquired MR signal may be processed to fill into the k-space before image reconstruction.

In some embodiments, the image may be generated in an iterative process by repeating 401 and 402 for a certain number of times. During each of the repetitions, an MR signal may be acquired. The repetition times of the iterative process may be determined by the imaging system 110 or set by a user (e.g., a doctor). The reconstructed image may be a $T_1$ weighted image, a $T_2$ weighted image, a proton density weighted image, a FLAIR (fluid attenuated inversion recovery) image, or the like. In some embodiments, the image may be further processed to generate a medical report. In some embodiments, a MR spectrum may be generated based on the MR signal.

It should be noted that the above description is provided for the purposes of illustration, not intended to limit the scope of the present disclosure. For persons having ordinary skills in the art, multiple variations and modifications may be reduced to practice in the light of the present disclosure. However, those variations and modifications do not depart from the scope of the present disclosure. For example, the reconstructed image and/or the generated report may be output to a related device (e.g., input/out 330, server 140, terminal devices 150, or any other devices disclosed in the present application). As another example, the acquired MR signal scan may be stored in a storage device (e.g., memory 320, storage 130, etc.) before image reconstruction.

Figure 5:
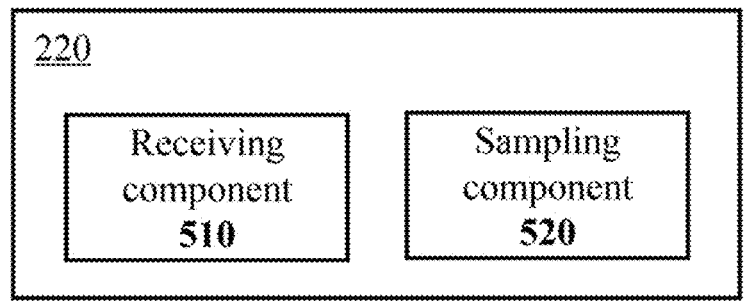
FIG. 5 is a schematic diagram illustrating an exemplary receiver according to some embodiments of the present disclosure.

FIG. 5 is a schematic diagram illustrating an exemplary receiver according to some embodiments of the present disclosure. Receiver 220 may include a receiving component 510 and a sampling component 520. Receiving component 510 may receive an MR signal. The MR signal may originate from one or more species of nuclei including, for example, hydrogen nuclei (i.e., $^{1}H$), or non-hydrogen nuclei (e.g., $^{3}He$, $^{7}Li$, $^{13}C$, $^{17}O$, $^{19}F$, $^{23}Na$, $^{31}P$, $^{129}Xe$, etc.), in the patient. In some embodiments, the MR signal may be an RF signal. In some embodiments, the RF signal may have a certain bandwidth between a minimum frequency and a maximum frequency. In some embodiments, the center frequency of the RF signal may be referred to as the frequency of the RF signal. Receiving component 510 may receive the MR signal from a specific part of the patient body including, for example, the head, the lung, the arms, the carotid artery, the spine, etc.

In some embodiments, receiving component 510 may include a coil element. The MR signal from a part of a patient body may be detected or collected by the coil element. The coil element may be a quadrature coil, a surface coil, a special coil, or the like, or any combination thereof. In response to the received MR signal, a current signal or a voltage signal may be generated in the coil element accordingly. In some embodiments, receiving component 510 may further include an amplifier and/or a filter. The amplifier may increase the amplitude of the MR signal. In some embodiments, the amplified MR signal may be sent to the filter. The filter may remove, from the MR signal, specific interference frequency components or noise. In some embodiments, the filter may remove, from the MR signal, certain frequency components outside the imaging bandwidth to avoid the aliasing which appears in the frequency spectrum during the process of the following signal processing.

Sampling component 520 may sample the MR signal received by receiving component 510. Various sampling techniques may be applied while sampling the MR signal. Exemplary sampling techniques may include simple random sampling, stratified sampling, probability-proportional-to-size sampling, accidental sampling, cluster sampling, or the like, or any combination thereof. In some embodiments, an oversampling and band pass sampling technique may be applied in the sampling process. As used herein, oversampling may refer to the sampling of a signal at a sampling rate higher than twice the bandwidth of the MR signal. Conversely, band pass sampling may refer to the sampling of a signal at a sampling rate lower than twice the center frequency of the MRI scanner 111.

In some embodiments, various signal processing techniques may be applied during the sampling process. Exemplary signal processing techniques may include time-frequency analysis, differential equations, spectral estimation, a linear time-invariant system theory, numerical analysis, a transform theory, or the like, or any combination thereof. In some embodiments, the signal processing techniques may be performed by one or more electronic devices or components. Merely by ways of example, the devices may include filters, ADCs, signal compressors, digital signal processors (DSPs), or the like.

In some embodiments, sampling component 520 may further include other devices (for example, a clock synthesizer, a demultiplexer, a multiplexer, etc.) that contributes to the MR signal sampling. For example, sampling component 520 may further include a clock synthesizer. The clock synthesizer may generate a clock signal. In some embodiments, the clock signal may be received from a control software. The clock signal may be provided to an ADC, and the sampling rate of the ADC may be determined based at least partially on the clock signal. More description of the clock signal may be found elsewhere is the present application. See, for example, FIG. 7 and the descriptions thereof. In some embodiments, sampling component 520, including one or more devices mentioned above, may generate a digitized signal based on the received RF signal. The desired frequency of the digitized signal may fall into the frequency band between 0 and fs/2 (fs may denote the sampling rate).

Figure 6:
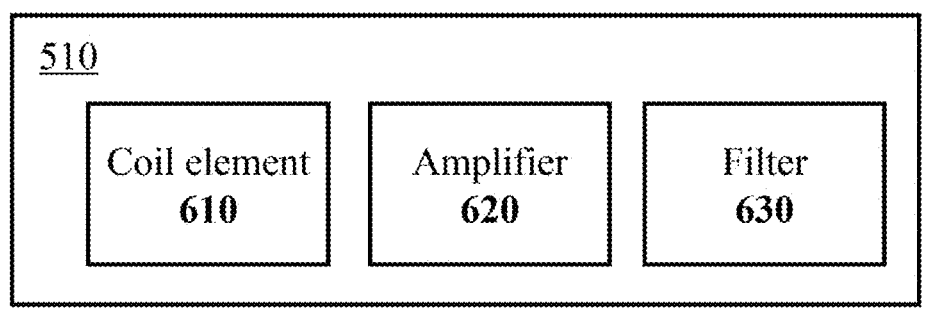
FIG. 6 is a schematic diagram illustrating an exemplary receiving component according to some embodiments of the present disclosure.

FIG. 6 is a schematic diagram illustrating an exemplary receiving component according to some embodiments of the present disclosure. Receiving component 510 may include an coil element 610, an amplifier 620, and a filter 630.

Coil element 610 may receive an MR signal. The MR signal may be originate from one or more species of nuclei including, for example, hydrogen nuclei (i.e., $^1$H), or non-hydrogen nuclei (e.g., $^3$He, $^7$Li, $^{13}$C, $^{17}$O, $^{19}$F, $^{23}$Na, $^{31}$P, $^{129}$Xe, etc.), in the patient. In some embodiments, the MR signal may be treated as an RF signal. In some embodiments, the RF signal may also be referred to as FID signal. The MR signal from a specific nucleus may have a center frequency and a bandwidth. The center frequency and the bandwidth of the MR signal may be included in the frequency band of the MRI scanner 111. In some embodiments, the center frequency and the bandwidth of the MR signal may relate to the static magnetic field strength (Bo).

In some embodiments, coil element 610 may receive the MR signal of a specific frequency or a narrow bandwidth that corresponds to a single nucleus species. For example, coil element 610 may be configured to receive the hydrogen nuclei signal in a 3T static magnetic field. As used herein, the hydrogen nuclei signal may refer to an MR signal emitted from a patient body after an RF pulse with the hydrogen nuclei resonance frequency is applied. In some embodiments, coil element 610 may receive the MR signal of another narrow bandwidth that corresponds to non-hydrogen nuclei (for example, $^3$He, $^7$Li, $^{13}$C, etc.). The MR signal, received from one or more nuclei, may induce a voltage signal or a current signal in coil element 610. In some embodiments, coil element 610 may generate a time-varying analog signal based on the voltage signal or the current signal. The amplitude of the analog signal may relate to the intensity of the MR signal and the nucleus species.

Merely byway of example, coil element 610 may include a quadrature coil, a surface coil, a special coil, or the like, or any combination thereof. The quadrature coil may be used to detect or collect MR signals from a part of a body in a three-dimensional manner. The surface coil may be used to detect or collect MR signals from a part of a body in a two-dimensional manner. The special coil may include a body phased array coil, a surface phased array coil, an element-directed spectroscopy coil, or the like, or any combination thereof. In some embodiments, receiving component 510 may include a plurality of coil elements 610 (for example, a coil array). Each of the plurality of coil elements may have a specific receiving bandwidth that corresponds to a single nucleus species. The number, position, and shape of the plurality of coil elements 610 may relate to the request for an effective induction area or a signal-to-noise ratio (SNR).

Amplifier 620 may preserve or enhance the energy in the MR signal with little additive noise. Amplifier 620 may connect to coil element 610 and receive the MR signal from coil element 610. In some embodiments, the MR signal may be in the form of an analog signal. Amplifier 620 may increase the amplitude of the analog signal. In some embodiments, amplifier 620 may multiply the analog signal with a factor that relates to the magnitude of the amplification. The factor may be a number (for example, 1000), set by a user (for example, a doctor), determined by imaging system 110, etc.

In some embodiments, amplifier 620 may be implemented on a device or equipment stand-alone or an electrical circuit integrated in receiving component 510. For example, amplifier 620 may be a low noise amplifier (LNA), a microwave low noise amplifier (WLNAXX), or the like, or any combination thereof. The LNA may include a transistor amplifier, a field effect transistor (FET) amplifier, or the like, or any combination thereof. The LNA may amplify the RF signals with very low amplitude without significantly degrading their signal-to-noise ratio (SNR). The WLNAXX may include a semiconductor diode parametric amplifier, or the like.

In some embodiments, amplifier 620 may introduce additive white noise into the MR signal. The noise may influence the frequency components and/or the amplitude of the MR signal. The noise may relate to the characteristics of amplifier 620. To reduce the side effect of additive white noise, one or more filters may be needed. In some embodiments, the number of filters may be determined, at least partially, based on the additive white noise.

Filter 630 may remove some frequency components of the received MR signal Filter 630 may have a pass band that is delimited by a lower limit and an upper limit. Filter 630 may remove, from the MR signal, certain frequency components (for example, components of certain frequencies, noise, etc.) that are outside the pass band. For example, filter 630 may suppress the components whose frequencies equal to half the ADC sampling rate. As another example, filter 630 may suppress noise power larger than a threshold. In some embodiments, filter 630 may remove the additive noise introduced by amplifier 620 as well as certain frequency components of the MR signal.

Filter 630 may include an anti-aliasing filter (AAF), an inductor capacitor filter (LC filter), a low-pass filter, a high-pass filter, a band-pass filter (BPF), a band-stop filter, a notch filter, or the like, or any combination thereof. Filter 630 may be operably (or electrically) connected to coil element 610 or amplifier 620. In some embodiments, filter 630 may be operably (or electrically) connected to amplifier 620 to calibrate the amplified MR signal. In some embodiments, the MR signal may be filtered by one or more filters 630 to avoid folded or aliased components that may appear in the imaging bandwidth during an analog-to-digital conversion.

Figure 7:
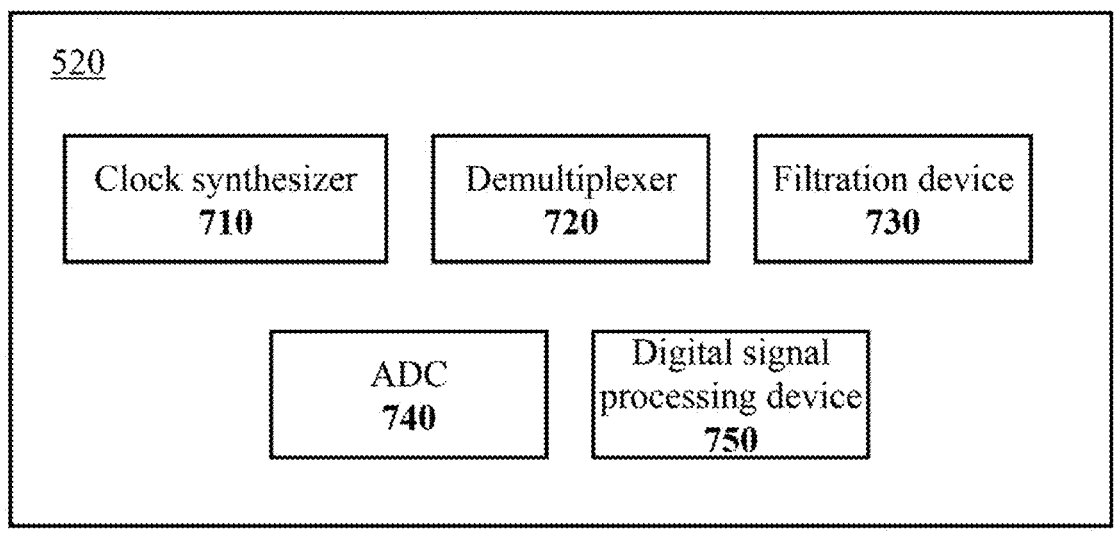
FIG. 7 is a schematic diagram illustrating an exemplary sampling component according to some embodiments of the present disclosure.

FIG. 7 is a schematic diagram illustrating an exemplary sampling component according to some embodiments of the present disclosure. Sampling component 520 may be connected to or communicate with receiving component 510 and sample the received MR signal. Sampling component 520 may include a clock synthesizer 710, a demultiplexer 720, a filtration device 730, an ADC 740, and a digital signal processing device 750.

Clock synthesizer 710 may generate a clock signal. The clock signal may be used to determine the sampling rate of sampling component 520. One or more frequencies (for example, 300 MHz, 600 MHz, 1 GHz, etc.) may be provided by the clock signal. The clock signal may be acquired from a clock, an oscillator, another frequency synthesizer, or any other suitable clock source. In some embodiments, the clock signal may be acquired from a clock source outside of receiver 220. In some embodiments, the clock signal may be received from a control software installed in computing device 112. In some embodiments, the clock signal may be acquired from processor 310. Clock synthesizer 710 may generate the clock signal base on a factor. In some embodiments, the factor may be an integer (for example, 5, 6, 10, etc.) The factor may be a value, set by a user via input/output 330, or determined by imaging system 110. In some embodiments, the factor may be determined based at least partially on the bandwidth of the MR signal.

One or more sampling rates may be provided by the clock signal. In some embodiments, the sampling rates may be generated based on the divide factor. For example, given a clock signal of 600 MHz, the sampling rate may be reduced to 100 MSPS by a factor of 6.

In some embodiments, the clock signal that may provide the sampling rates may be sent to ADC 740. ADC 740 may choose a sampling rate (divide factor) to sample the received signals (e.g., the MR signal). In some embodiments, the clock signal providing one or more sampling rates may be further sent to digital signal processing device 750. In some embodiments, the clock signal may be sent to a decimation filter in digital signal processing device 750 as main working frequency.

Clock synthesizer 710 may be composed of a direct digital synthesizer (DDS), a clock data recover (CDR) device, a phase-locked loop (PLL), a clock divider, a clock fan-out driver, or the like, or any combination thereof. In some embodiments, clock synthesizer 710 may be a local device within sampling component 520, or a remote device connects to sampling component 520 in a wired connection or a wireless connection.

Demultiplexer 720 may receive an MR signal and forward the received signal to a data line. In some embodiments, demultiplexer 720 may be used on the receiving end of sampling component 520. In some embodiments, demultiplexer 720 may be connected to receiving component 510. In some embodiments, demultiplexer 720 may include a plurality of switches. Each of the plurality of switches may be connected to one of multiple data lines. Each of the multiple data lines may have a specific pass band. In some embodiments, one or more electronic devices or elements may be implemented in each of the multiple data lines. For example, at least one filter may be included in each of the multiple data lines. Demultiplexer 720 may select one of a plurality of switches and forward the MR signal to the data line that is connected to the selected switch. For example, each of the plurality of switches may be connected to a data line in which a filter and an amplifier are included. Demultiplexer 720 may select a switch and forward the MR signal to the filter.

Demultiplexer 720 may select a switch based on a default setting, an operation from a user, or a control signal provided by imaging system 110. In some embodiments, the control signal provided by imaging system 110 may be generated based on the nucleus species of interest, a feature thereof (e.g., the center frequency of the MR signal, the bandwidth of the MR signal, etc.), the pass band of data line, or the like, or a combination thereof. In some embodiments, demultiplexer 720 may select one of a plurality of switches based on both the frequency of the RF signal and the pass band of the connected data line. For example, demultiplexer 720 may select a switch if the pass band, of the data line that connected to the switch, contains the center frequency of the RF signal.

In some embodiments, a multiplexer may be provided, as a complementary component, together with demultiplexer 720. See, for example, FIG. 14 and the description thereof. The multiplexer may receive the MR signal that has passed through demultiplexer 720. The multiplexer may also include a plurality of switches. Each of the plurality of switches in the multiplexer may connect to one of the multiple data lines. The multiplexer may select one of a plurality of switches and receive the MR signal from the data line. In some embodiments, the multiplexer may select the switch based on the operation of demultiplexer 720. More description of demultiplexer 720 may be found elsewhere in the present application. See, for example, FIG. 8 and the description thereof.

Filtration device 730 may remove unwanted frequency components from the MR signal. In some embodiments, filtration device 730 may have a specific pass band. In some embodiments, filtration device 730 may remove some frequency components outside its pass band to avoid aliasing that may occur during the analog-to-digital conversion. The frequency components may be one or more discrete frequency components or successive frequency components within a certain range.

Filtration device 730 may remove unwanted frequency components of the MR signal. In some embodiments, the MR signal may be received from demultiplexer 720. In some embodiments, filtration device 730 may be implemented in the multiple data lines. Filtration device 730 may have a pass band between an upper limit and a lower limit. Filtration device 730 may remove, from the MR signal, certain frequency components (for example, components of certain frequencies, noise, etc.) outside the pass band. In some embodiments, filtration device 730 may remove, from the MR signal, frequency components outside the pass band. For example, filtration device 730 may remove noise or scattering whose frequency is equal to half of an integral multiple of the sampling rate of ADC 740. That is, filtration device 730 may remove noise or scattering whose frequency is f, $f=n \cdot f_s/2$, where n may be an integer, and $f_s$ may denote the sampling frequencies of ADC 740. The pass band of filtration device 730 may relate to the center frequency(ies) and the bandwidth(s) of one or more nuclei species. For example, the pass band of filtration device 730 may contain the center frequency or center frequencies of one or more nuclei species. In some embodiments, the pass band of filtration device 730 may be set at least partially based on the center frequency(ies) and the bandwidth(s) of one or more nuclei species. In some embodiments, the pass band of filtration device 730 may relate to the sampling rate of ADC 740. For example, the pass band of selected data path could not include $n \cdot f_s/2$, in order to avoid the appearance of folded or aliased components in the frequency spectrum during the analog-to-digital conversion.

In some embodiments, filtration device 730 may be implemented on a hardware device (for example, an integrated circuit). In some embodiments, filtration device 730 may be an AAF. Filtration device 730 may include a low-pass filter, a high-pass filter, a band-pass filter (BPF), a band-stop filter, a notch filter, or the like, or any combination thereof.

In some embodiments, filtration device 730 may include one or more filters. In some embodiments, filtration device 730 may be connected to demultiplexer 720 by connecting each of the filters to a switch in demultiplexer 720. The number of filters may be set by a user, or determined by imaging system 110 based on the MR signal. In some embodiments, the number of the filters may be determined by imaging system 110 based on the additive white noise of the amplifier in the sampling component 520 present in the MR signal chain. If there is no additive white noise in the MR signal, filtration device 730 may need just one filter. More description regarding filtration device 730 may be found elsewhere in the present application. See, for example, FIG. 9, FIG. 14, and FIG. 15, and the descriptions thereof.

ADC 740 may convert the MR signal into a digital signal. The MR signal received by receiving component 510 may be an analog signal ADC 740 may discretize the analog signal into a digital signal. For example, ADC 740 may convert the MR signal in the form of a voltage signal or a current signal into a set of digital binaries based on (e.g., proportional to) the amplitude of the voltage or current. Merely by way of example, ADC 740 may be a flash ADC, a successive-approximation ADC, a ramp-compare ADC, a Wilkinson ADC, an integrating ADC, a delta-encoded ADC, a pipelined ADC, a sigma-delta ADC, a time-interleaved ADC, etc.

In some embodiments, ADC 740 may be provided with a specific sampling rate during the analog-to-digital conversion of the MR signal. In some embodiments, the MR signal may be oversampled by ADC 740. As used herein, a signal being sampled at a frequency greater than twice the frequency of the signal may be referred to as oversampling. According to the Nyquist sampling theorem, a signal may need to be sampled at a frequency greater than twice its frequency to maintain the signal quality. For example, if the frequency of an MR signal is 70 MHz, the minimum sampling rate of ADC 740 may be 140 MSPS according to Nyquist criterion.

In some embodiments, the MR signal may be sampled by ADC 740 with band pass sampling technique. As used herein, band pass sampling may refer to the sampling at a rate that does not meet the Nyquist criterion. Merely byway of example, if ADC 740 samples an MR signal of 70 MHz at a sampling rate of 100 MSPS, the MR signal may be considered to be sampled with band pass sampling. During band pass sampling, some components of the MR signal may be folded. For example, if ADC 740 samples an MR signal of 70 MHz at a sampling rate of 100 MSPS, components of certain frequencies may be folded. The folded components may appear at 30 MHz. With the AAF in front of ADC 740, there would be almost no SNR loss even if mirror folding happens. And the following digital signal processing device 750 may just process the 30 MHz signal. In some embodiments, an undersampling technique may be used to down convert (i.e., reduce the frequency of) an MR signal. ADC 740 may down convert the MR signal to a lower frequency.

In some embodiments, the sampling rate of ADC 740 may be determined based on a default value, an input from a user, or a clock signal provided by clock synthesizer 710. In some embodiment, the sampling rate of ADC 740 may be provided by clock synthesizer 710. Clock synthesizer 710 may generate the clock taking into consideration the nucleus species, a feature thereof (e.g., the center frequency of the MR signal, the bandwidth of the MR signal, etc.), the pass band of filtration device 730, or the like, or a combination thereof. In some embodiments, the sampling rate may be generated by clock synthesizer 710 to achieve band pass sampling.

Digital signal processing device 750 may process the digitized MR signal. Digital signal processing device 750 may be connected to ADC 740 to receive the digitized MR signal. Various operations may be used to process the digitized MR signal in digital signal processing device 750. Exemplary processing operations may include down conversion, filtering, decimation, I/Q demodulation, compression, or the like, or any combination thereof. In some embodiments, one or more electronic devices or elements may be included in digital signal processing device 750. For example, digital signal processing device 750 may include a decimation filter, a numerically controller oscillator (NCO), a multiplier, a poly-phase decimation FIR low pass filter, etc.

In some embodiments, digital signal processing device 750 may further include a plurality of channels. At least two of the plurality of channels may be included in digital signal processing device 750, within which different processing operations may be provided. In some embodiments, one of the plurality of channels may be selected based on the frequency of the MR signal or the nucleus species of interest. For example, the MR signal from hydrogen nuclei may be sent to a first channel, within which a poly-phase decimation FIR band pass filtering operation may be performed to generate an intermediate radio (IF) signal; the MR signal from non-hydrogen nuclei may be sent to a second channel, within which an I/Q demodulation may be performed to divide the MR signal into an in-phase signal (I signal) and a Quadrature signal (Q signal).

Merely by ways of example, an MR signal from hydrogen nuclei with a frequency of 128 MHz may be sampled by ADC 740 at a sampling rate of 100 MSPS. The MR signal may appear with 28 MHz after the analog-to-digital conversion. Subsequently, the MR signal may be sent to one of the plurality of channels. A decimation band pass filter, included in the channel, may sample the MR signal at a sampling rate of 10 MSPS, and the frequency of the MR signal be converted to 2 MHz. As another example, an MR signal from non-hydrogen nuclei with a frequency of 120.1 MHz may be sampled by ADC 740 at the same sampling rate of 100 MSPS. The MR signal may appear with 20.1 MHz after the analog-to-digital conversion. Assuming that the MR signal with a frequency of 20.1 MHz is sent to the same channel, the decimation band pass filter within the channel may sample the MR signal at 10 MSPS. It may be difficult for the decimation band pass filter to remove the frequency components of 19.9 MHz. Thus, another channel, within which an I/Q demodulation and a decimation low pass filtering may be provided to process such MR signal.

In some embodiments, digital signal processing device 750 may generate an IF signal. In some embodiments, digital signal processing device 750 may reduce data rate of the digitized MR signal.

Figure 14:
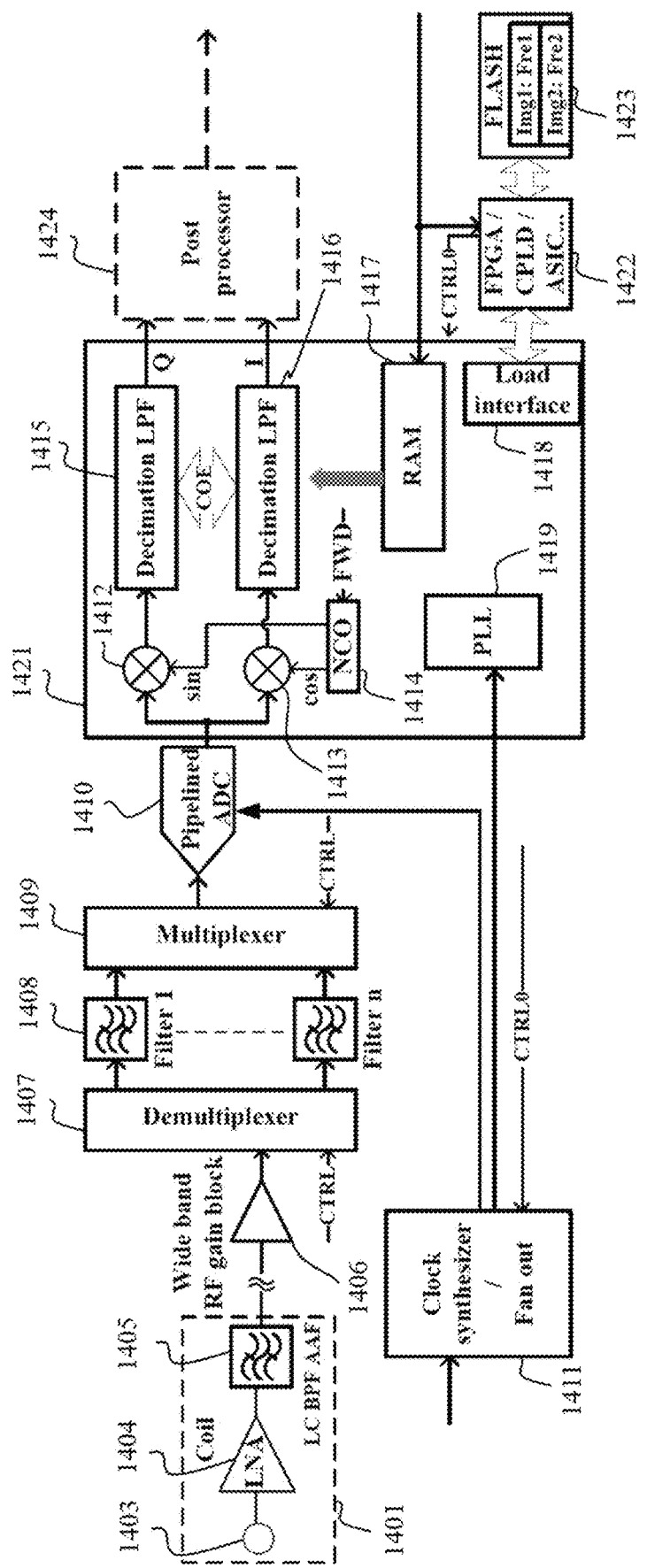
FIG. 14 is a schematic diagram illustrating an exemplary receiver according to some embodiments of the present disclosure.

In some embodiments, digital signal processing device 750 may be implemented on an electronic device or an electric circuit. FIG. 14 and the description thereof illustrate exemplary electronic devices and electric circuits. For example, digital signal processing device 750 may be a field-programmable gate array (FPGA), a digital signal processor (DSP), an application specific integrated circuit (ASIC), an application-specific instruction-set processor (ASIP), a physics processing unit (PPU), a microcontroller unit, an advanced reduced instruction set computer (RISC) machine (ARM), a programmable logic device (PLD), or the like, or any combination thereof. In some embodiments, digital signal processing device 750 may be implemented by way of a software or a program, for example, the Matlab.

It should be noted that the above description of the process for generating a corrected image is merely provided for the purposes of illustration, and not intended to limit the scope of the present disclosure. For persons having ordinary skills in the art, multiple variations or modifications may be made under the teachings of the present disclosure. For example, sampling component 520 may further include an amplifier. The additive noise of the amplifier may be removed by filtration device 730. The number of filters included in filtration device 730 may relate to the additive noise of the amplifier. If there is almost no additive noise, filtration device 730 may just include one filter. However, those variations and modifications do not depart from the scope of the present disclosure.

Figure 8:
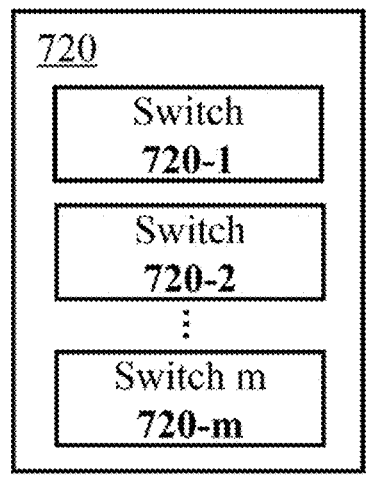
FIG. 8 is a schematic diagram illustrating an exemplary demultiplexer according to some embodiments of the present disclosure.

FIG. 8 is a schematic diagram illustrating an exemplary demultiplexer according to some embodiments of the present disclosure. As illustrated in FIG. 8, demultiplexer 720 may include a plurality of switches, like switch 720-1, switch 720-2, . . . , switch 720-m. In some embodiments, each of the switches may be connected to a data line. Upon receiving an MR signal, demultiplexer 720 may select one of the m switches, and forward the MR signal to a data line that is connected to the selected switch. The data line connected to a specific switch may have a certain pass band. Demultiplexer 720 may select one of the multiple switches, switch 720-1 through switch 720-m, based on a default setting, an operation or instruction from a user, or a control signal provided by imaging system 110. In some embodiments, the control signal provided by imaging system 110 may be generated based on the center frequency and the bandwidth of the MR signal, and the pass band of a data line. For example, the control signal may be generated, and demultiplexer 720 may select, based on the control signal, a switch when the center frequency of the MR signal falls within the pass band of the data line connected with the switch.

The multiplexer, provided together with demultiplexer 720, may also have multiple switches. In some embodiments, the number of switches included in the multiplexer may equal to that of demultiplexer 720. The multiplexer may select the switch based on the operation of demultiplexer 720.

Figure 9:
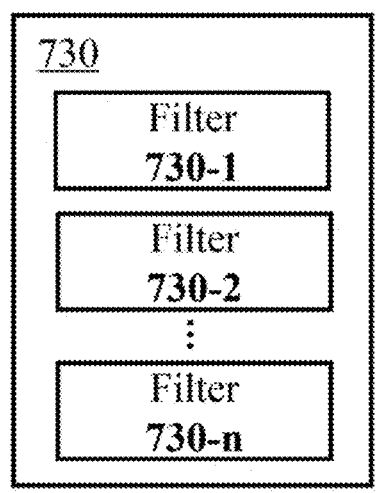
FIG. 9 is a schematic diagram illustrating an exemplary filtration device according to some embodiments of the present disclosure.

FIG. 9 is a schematic diagram illustrating an exemplary filtration device according to some embodiments of the present disclosure. As is illustrated in FIG. 9, filtration device 730 may include a plurality of filters, such as filter 730-1, filter 730-2, . . . , filter 730-n. In some embodiments, filter 730-1 through filter 730-n may be of the same type. For example, all of the filters, filter 730-1 through filter 730-n, may be AAFs. In some embodiments, each of the filters, filter 730-1 through filter 730-n, may be any type of filter, such as a low-pass filter, a high-pass filter, a band-pass filter (BPF), a comb filter, an all-pass filter, or the like, or any combination thereof. In some embodiments, at least two of the filters may be of different types. For example, filter 730-1 may be a high-pass filter, filter 730-n may be a low-pass filter, and other filters may be BPFs.

In some embodiments, each of the plurality of filters, filter 730-1 through filter 730-n, may have a pass band with a certain frequency range. In some embodiment, the pass band of filtration device 730 may be determined based on the pass bands of the plurality of filters. For example, the available bandwidth of filtration device 730 may equal to the sum of the pass band widths of filter 1 through filter n. In some embodiments, at least two of the plurality of filters, filter 730-1 through filter 730-n, may have the same pass band with the same frequency range. In some embodiments, at least two of the plurality of filters, filter 730-1 through filter 730-n, may have different pass bands with different frequency ranges. In some embodiments, the pass band of each filter may be different from each other. In some embodiments, the pass band of each filter may correspond to signals from one or more nuclei species. For example, the pass band of filter 1 may contain the center frequencies of $^1H$ and $^{19}F$, and the pass band of filter 2 may only contain the center frequency of $^{13}C$. More description of the pass band of the filters may be disclosed elsewhere in the present application. See, for example FIG. 15 and the description thereof.

In some embodiments, the number of the filters in filtration device 730 may equal to the number of the switches in demultiplexer 720. In some embodiments, filter 730-1 through filter 730-n may be connected to switch 720-1 through switch 720-m, respectively.

Figure 10:
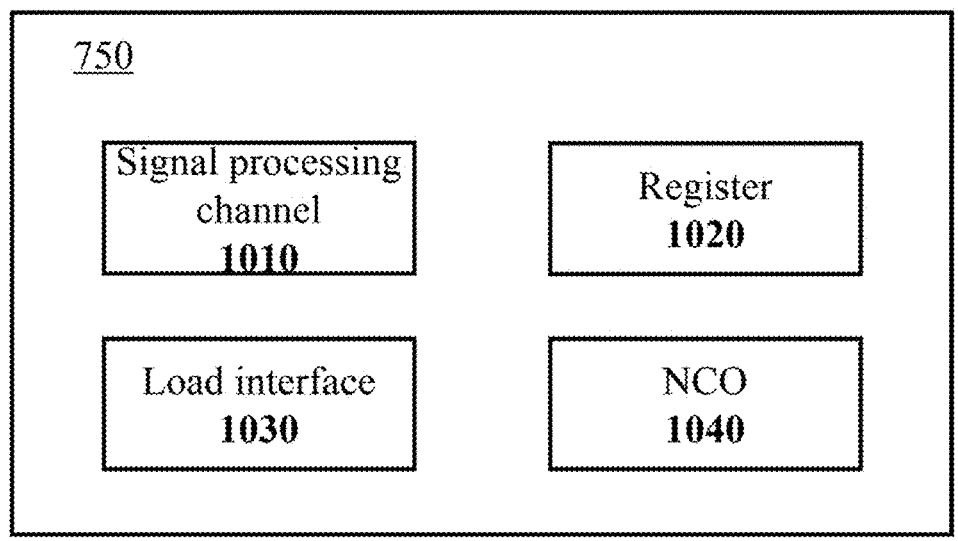
FIG. 10 is a schematic diagram illustrating an exemplary digital signal processing device according to some embodiments of the present disclosure.

FIG. 10 is a schematic diagram illustrating an exemplary digital signal processing device according to some embodiments of the present disclosure. Digital signal processing device 750 may include a signal processing channel 1010, a register 1020, and a load interface 1030. In some embodiments, signal processing channel 1010, register 1020, and load interface 1030 may be implemented on a field-programmable gate array (FPGA), a digital signal processor (DSP), or an application specific integrated circuit (ASIC).

Signal processing channel 1010 may provide one or more channels to process the MR signal. The one or more channels may receive the digitized MR signal from ADC 740. In some embodiments, signal processing channel 1010 may include a single channel to process the MR signal. In some embodiments, signal processing channel 1010 may include a plurality of channels. At least two of the plurality of channels may process the MR signal by different operations. The processing operations performed in the plurality of channels may include down conversion, filtering, amplification, decimation, I/Q demodulation, compression, or the like, or any combination thereof. Signal processing channel 1010 may select a channel for processing an MR signal. In some embodiments, the channel may be selected based on the frequency of the MR signal. For example, the MR signal from hydrogen nuclei may be sent to a first channel, within which a decimation band pass filtering operation may be performed to generate an intermediate radio (IF) signal; the MR signal from non-hydrogen nuclei may be sent to a second channel, within which an I/Q demodulation may be performed to divide the MR signal into an in-phase signal (I signal) and a Quadrature signal (Q signal). More description of signal processing channel 1010 may be disclosed elsewhere in the present application. See, for example, FIG. 11 and the description thereof.

Signal processing channel 1010 may include one or more electronic devices or elements in each channel to perform the operations mentioned above. The electronic devices or elements may include filters, multipliers, decimation filters, or the like, or any combination thereof. For example, each of the plurality of the channels may include a decimation filter. The decimation filter may be a low-pass decimation filter, a high-pass decimation filter, a band-pass decimation filter, etc. In some embodiments, the decimation filter may receive a clock signal, and decimate the MR signal based on the clock signal. After decimation, the data rate of the MR signal may be reduced. In some embodiments, the clock signal may be provided by clock synthesizer 710.

Register 1020 may store information. The stored information may relate to MR signal processing, or other information generated by or provided for digital signal processing device 750. Register 1020 may store clock signals (e.g., the clock signal generated by clock synthesizer 710), logic information (e.g., logic information of digital signal processing device 750), or the like, or any combination thereof. For example, register 1020 may store the clock signal received from the control software mentioned above. The clock signal may be used to determine the sampling rate of the decimation filters in signal processing channel 1010. As another example, register 1020 may store logic information of digital signal processing device 750. Logic information may be used to modify the signal processing operation of digital signal processing device 750. For instance, logic information may be used to alter one or more channels and/or processing operation therein, reset the coefficients of the decimation filter, etc. In some embodiments, logic information may relate to the sampling rate of receiving component 520 (for example, divide factor of clock synthesizer 710). For example, if the sampling rate of ADC 740 is changed, logic information may change accordingly.

In some embodiments, the digitized MR signal may be written to register 1020. In some embodiments, the digitized MR signal may be a binary number with a certain bit-width. The bit-width of the signal may be referred to as the bit-width of a number (e.g., a binary number) that the signal corresponds to. In some embodiments, register 1020 may be used for bit-width extension, truncation, combination, etc. In some embodiments, register 1020 may be used as an extension element to extend the bit-width of the MR signal. In some embodiments, register 1020 may be used as a truncation element to truncate the bit-width of the MR signal. In some embodiments, register 1020 may be further used as a combination element to mix two MR signals, and the bit-width of the two MR signals may be added together. For example, a combination element may combine the a 12 bit first signal and a 12 bit second signal and generate a binary number of 24 bit corresponding to the combined signal.

Register 1020 may be a programmer-visible register, a programmable read-only memory, a Nano-RAM, a thin film memory, a magnetic-core memory, a magnetic drum memory, a magnetic resistance random access memory, a flash memory, an electronic erasable programmable read-only memory, an erasable programmable read-only memory, a race-track memory, a programmable metallization memory, or the like, or any combination thereof. In some embodiments, register 1020 may be a local device located within digital processing device 750. In some embodiments, register 1020 may be a remote device external to digital processing device 750. In some embodiments, register 1020 may be connected to and receive information from processor 310, memory 320, input/out 330, or storage 130 via network 120.

Load interface 1030 may be used to update logic information for digital processing device 750. Load interface 1030 may be a device connected to a programmable device that inputs and/or modifies logic information of digital processing device 750. In some embodiments, load interface 1030 may receive logic information from a memory or a programmable local device. In some embodiments, load interface 1030 may process logic information and send it to a component in digital signal processing device 750 to control the operation of the component. Load interface 1030 may connect with other components of digital processing device 750 in a wired or wireless connection.

NCO 1040 may generate one or more periodical signals, such as a cosinusoid signal, a sinusoid signal, etc. The periodical signals may be provided to signal processing channel 1010. For example, orthogonal NCO outputs (e.g., a cosinusoid signal and a sinusoid signal) may be sent to two multipliers in signal processing channel 1010 respectively. The two multipliers may multiply the MR signal from non-hydrogen nuclei in two different channels with the cosinusoid signal and the sinusoid signal, respectively.

Figure 11:
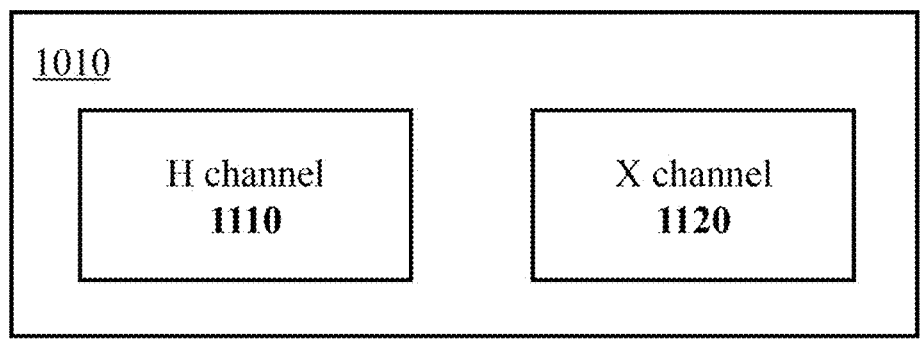
FIG. 11 is a schematic diagram illustrating an exemplary signal processing channel according to some embodiments of the present disclosure.

FIG. 11 is a schematic diagram illustrating an exemplary signal processing channel according to some embodiments of the present disclosure. Signal processing channel 1010 may include an H channel 1110 and an X channel 1120.

H channel 1110 may process a hydrogen nuclei signal. X channel 1120 may process anon-hydrogen nuclei signal. As used herein, the hydrogen nuclei signal may refer to an MR signal originating from hydrogen nuclei; non-hydrogen nuclei signal may refer to an MR signal originating from non-hydrogen nuclei (e.g., one or more nuclei species selected from $^3$He, $^7$Li, $^3$C, $^{17}$O, $^9$F, $^{23}$Na, $^{31}$P, $^{12}$Xe, etc.). In some embodiments, the processing of the non-hydrogen nuclei signal may be different compared with the processing of the hydrogen nuclei signal. In some embodiments, H channel 1110 may include a decimation filter. The decimation filter may down convert the frequency of the hydrogen nuclei signal to generate an IF signal.

In some embodiments, X channel 1120 may include an UQ demodulator. The I/Q demodulator may divide the non-hydrogen nuclei signal into two sub-channels (for example, an I sub-channel and a Q sub-channel). In some embodiments, the I/Q demodulator may demodulate the non-hydrogen nuclei signal in the sub-channels to an in-phase signal (also referred to as I signal) and a quadrature signal (also referred to as Q signal). Merely by way of example, the I/Q demodulator may include two multipliers, and two poly-phase low pass decimation filters. The I/Q demodulation may be performed by the two multipliers, and the two low pass decimation filters. The two multipliers may receive the orthogonal NCO outputs and multiply the non-hydrogen nuclei signal in the I sub-channel and Q sub-channel with the orthogonal NCO outputs (for example, a cosinusoid signal and a sinusoid signal, respectively). The multiplication may be performed to down mix the frequency of the non-hydrogen nuclei signal. As used herein, down mix may refer to a shift operation that may move the frequency components of an MR signal towards the negative direction, thereby reducing the frequency of the MR signal. The portion of the non-hydrogen nuclei signal in each of the two sub-channels may be further processed by the low pass decimation filters. In some embodiments, the low pass decimation filter may remove, from a portion of the non-hydrogen nuclei signal, components of negative frequency and noise, and/or reduce the data rate. After the demodulation, an IF signal may be generated.

In some embodiments, there may be differences in terms of human body abundance of hydrogen nuclei and non-hydrogen nuclei. The available bit-width of corresponding MR signals (hydrogen nuclei signal and non-hydrogen nuclei signal) may be different accordingly. In some embodiments, an operation to equalize the final bit-width of the hydrogen nuclei signal and the non-hydrogen nuclei signal may be performed.

An exemplary operation on the bit-width for the hydrogen nuclei signals and non-hydrogen nuclei signal may be described as follows. It should be noted that description below is provided for illustration purposes, not intended to limit the present application. In H channel 1110, the bit-width of the hydrogen nuclei signal may be extended, for example, by an extender. In some embodiments, the bit-width of the hydrogen nuclei signal may be extended from M bits to M+k bits, where k may denote a natural number (for example, k=0, 1, 2, . . . ), M may denote the actual available bit-width of the hydrogen nuclei signal, and M+k may be an even number. In some embodiments, the extender may perform bit-width extension by, for example, adding zeros after the least significant bit (LSB) corresponding to the hydrogen nuclei signal or adding signs before the most significant bit (MSB) corresponding to the hydrogen nuclei signal, or a combination of both. For instance, the extension element may perform bit-width extension by adding k zeros after the LSB corresponding to the hydrogen nuclei signal. As another example, the extender may perform bit-width extension by adding k signs before the MSB corresponding to the hydrogen nuclei signal. As a further example, the extension element may perform bit-width extension by adding i zeros after the LSB corresponding to the hydrogen nuclei signal, and adding (k-i) signs before the MSB corresponding to the hydrogen nuclei signal, where i is an integer no greater than k. In X channel 1120, the bit-widths of both I signal and Q signal may be truncated, for example, by two truncation elements. In some embodiments, bit-widths of both I signal and Q signal may be truncated to (M+k)/2. In some embodiments, the truncation elements may perform bit-width truncation by, for example, removing the MSB of the I signal and the Q signal. In some embodiments, a combination may be performed on the I signal and the Q signal after the truncation. The combination may be performed by, for example, a combination element. The combination element may combine the truncated I signal and the truncated Q signal and generate a M+k bits value corresponding to the non-hydrogen nuclei signal, whose bit-width equals to the bit-width of the extended hydrogen nuclei signal. In some embodiments, the extension element, the truncation element, and the combination element may be implemented in register 1020.

In some embodiments, X channel 1120 may share some common hardware devices with H channel 1110. For example, H channel 1010 and some X channel 1120 may share a decimation band pass filter. The hydrogen nuclei signal or non-hydrogen nuclei signal received from ADC 740 may be processed into IF signal using respective coefficients.

Figure 12:
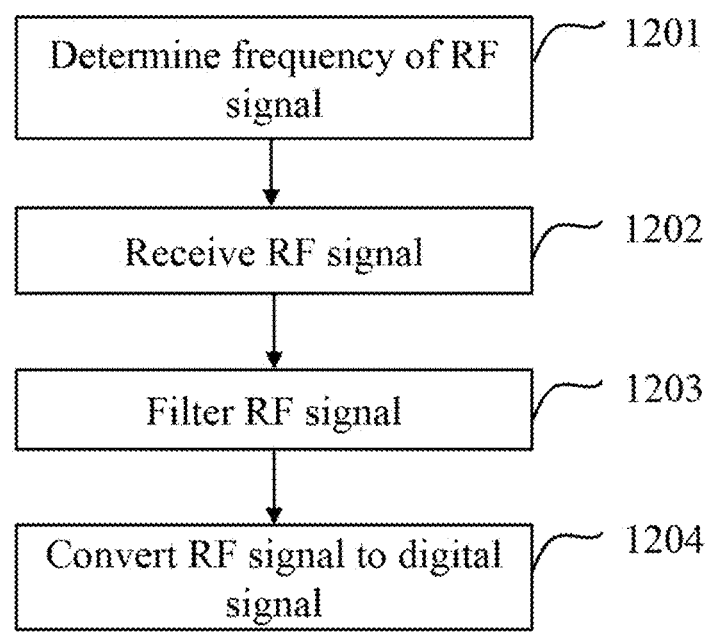
FIG. 12 is a flow chart of an exemplary process for generating a digital signal based on the input RF signal according to some embodiments of the present disclosure.

FIG. 12 is a flowchart of an exemplary process for generating a digital signal based on an input RF signal according to some embodiments of the present disclosure. In 1201, the frequency of the RF signal may be determined. In some embodiments, a coil element designed for a particular species of nuclei may be installed on receiver 220. The coil element may have an ID that may indicate the receiving frequency range of the coil element. Imaging system 110 may determine the frequency of the RF signal to be generated according to the ID of the installed coil element. After the determination of the frequency of the RF signal to be generated, an MR scan may be performed accordingly.

In 1202, an RF signal may be received. In some embodiments, the RF signal may also be referred to as FID signal. The RF signal may bean MR signal originating from hydrogen nuclei ($^1$H) or non-hydrogen nuclei (such as $^3$He, $^7$Li, $^{13}$C, $^{17}$O, $^{19}$F, $^{23}$Na, $^{31}$P, $^{129}$Xe, etc.) The RF signal may be received by the coil element. The coil element may receive the RF signal by the way electromagnetic induction and induce analog signals (for example, a voltage signal or a current signal).

In 1203, the RF signal may be filtered in at least one of multiple data lines. In some embodiments, filtration device 730 may be implemented in the multiple data lines. The RF signal may be filtered by filtration device 730. In some embodiments, filtration 730 may include a plurality of filters. Each filter may correspond to a pass band. The filter may perform filtering on the RF signal by passing the frequency components within the pass band and suppressing the frequency components outside the pass band. In some embodiments, the RF signal may be filtered by filtration device 730 to remove the frequency components that does not meet the Nyquist-Shannon criterion.

In 1204, the filtered RF signal may be converted to a digital signal. The conversion may be performed by, for example, ADC 740. ADC 740 may digitize the analog signal. For example, ADC 740 may convert the RF signal, being in the form of an analog voltage signal, to a set of digital binaries.

According to the Nyquist-Shannon sampling theorem, which is a modified version of the Nyquist sampling theorem, the sampling rate of ADC 740 may be larger than twice the maximum frequency of an RF signal. Multiple sampling rates may be provided for the sampling of the RF signal pursuant to the Nyquist-Shannon criterion. In some embodiments, ADC 740 may choose a sampling rate, from the multiple sampling rates, to sample the RF signal. In some embodiments, the multiple sampling rates may be provided by clock synthesizer 710.

In some embodiments, the conversion may be performed according to the band pass sampling technique. For example, ADC 740 may sample a narrow band RF signal with 70 MHz center frequency at a sampling rate of 120 MSPS. Some components of the RF signal may appear at 50 MHz (i.e. 120 MHz minus 70 MHz) due to mirror folding.

Thus, ADC 740 may lower all the frequency components of the RF signal as well as convert the RF signal to a digital signal.

Figure 13:
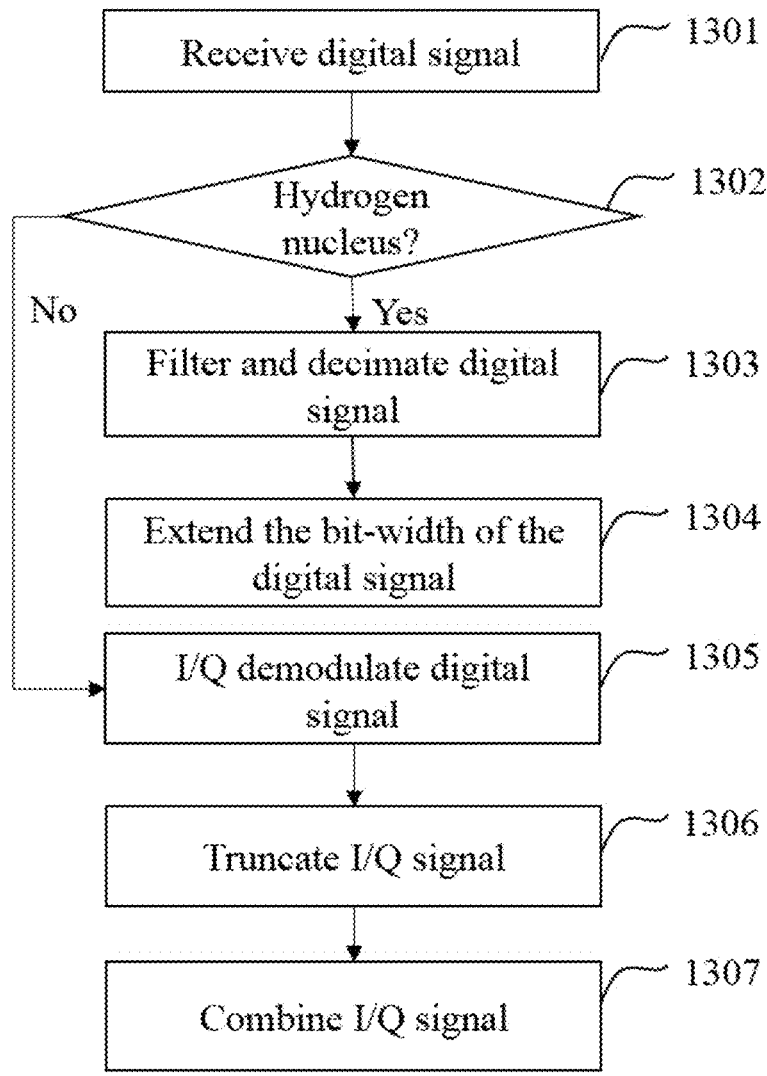
FIG. 13 is a flow chart of an exemplary process for generating IF signal based on the digital signal according to some embodiments of the present disclosure.

FIG. 13 is a flowchart of an exemplary process for generating IF signal based on the digital signal according to some embodiments of the present disclosure. In 1301, a digital signal may be received. In some embodiments, the digital signal may be an MR signal that is digitized by ADC 740. The MR signal may originate from a patient after an RF pulse with resonance frequency of certain nuclei is applied. In some embodiments, the nuclei may include hydrogen nuclei (H) or non-hydrogen nuclei (e.g., one or more nuclei species selected from $^3$He, $^7$Li, $^{13}$C, $^{17}$O, $^{19}$F, $^{23}$Na, $^{31}$P, $^{129}$Xe, etc.). The digital signal may be received by, for example, digital signal processing device 750.

In 1302, a determination as to whether the digital signal is from hydrogen nuclei or non-hydrogen nuclei may be made. If the digital signal is from hydrogen nuclei, the process may proceed to 1303, and the digital signal may be decimated and filtered by, for example, the decimation filter in H channel 1110. If the digital signal is from non-hydrogen nuclei, the process may proceed to 1305, and the digital signal may be demodulated into I signal and Q signal by, for example, the demodulator in X channel 1120.

In 1303, the digital signal may be filtered and decimated. The digital signal may be filtered and decimated by, for example, a decimation filter in H channel 1110. The decimation filter may be a band-pass decimation filter, a low-pass decimation filter, a high-pass decimation filter, or the like. In some embodiments, the decimation filter may be a band-pass decimation filter. In some embodiments, the decimation filter may remove, from the digital signal, certain frequency components (for example, negative frequencies) and noise. In some embodiments, the decimation filter may reduce the data rate. In some embodiments, the digital signal may be a value of a certain bit-width.

In 1304, the digitized signal of hydrogen nuclei may be extended. In some embodiments, the digitized signal may be extended from M bit to M+k bit, where k may denote a natural number (for example, k=0, 1, 2, . . . ), M may denote the actual bit-width of the hydrogen nuclei signal, and M+k may be an even number. In some embodiments, the bit-width extension may be performed by, for example, adding zeros after the LSB or adding signs before MSB, or a combination of both. For instance, the extender may perform bit-width extension by adding k zeros after the LSB corresponding to the hydrogen nuclei signal. As another example, the extender may perform bit-width extension by adding k signs before the MSB corresponding to the hydrogen nuclei signal. As a further example, the extender may perform bit-width extension by adding i zeros after the LSB corresponding to the hydrogen nuclei signal, and adding (k-i) signs before the MSB corresponding to the hydrogen nuclei signal, where i is an integer no greater than k. In some embodiments, the digital signal may be extended, for example, by an extension element. The extension element may be implemented in register 1020. In some embodiments, the signal after the processing operation may be an IF signal.

In 1305, the digitalized signal of non-hydrogen nuclei may be I/Q demodulated. In some embodiments, the digital signal of non-hydrogen nuclei may be duplicated such that the same digital signal of non-hydrogen nuclei may be sent to each of two sub-channels (for example, I sub-channel and Q sub-channel) in X channel 1120. In some embodiments, the I/Q demodulation may be performed by an I/Q demodulator. In some embodiments, the I/Q demodulator may include an NCO, two multiplier, and two low pass decimation filters. The I/Q demodulation may be performed by the NCO, the two multiplier, and the two low pass decimation filters. The NCO may generate one or more periodical signal, such as a cosinusoid signal and a sinusoid signal. The two multipliers may multiply the digital signal in the I sub-channel and the digital signal in the Q sub-channel with the cosinusoid signal and the sinusoid signal, respectively. The digital signal in the two sub-channels may be further processed by the low pass decimation filters. In some embodiments, the low pass decimation filter may remove, from the digital signal, negative frequency components and noise, and/or reduce the data rate. After I/Q demodulation, an I signal may be obtained in the I sub-channel, and a Q signal may be obtained in the Q sub-channel. Both the I signal and the Q signal are digital signals. In some embodiments, the I signal and Q signal may be values having the same bit-width.

In 1306, the I signal and the Q signal may be truncated. In some embodiments, both the I signal and the Q signal may be truncated to (M+k)/2 bits. In some embodiments, the truncation may be performed by, for example, removing the MSB of the I signal and the Q signal. In some embodiments, the truncation may be performed by, for example, one or two truncation elements. The truncation elements may be implemented in register 1020.

In 1307, the I signal and the Q signal may be combined. In some embodiments, the I signal and the Q signal may be combined by frequency mixing. In some embodiments, the combined signal may be a binary number of M+k bits, which equals to the bit-width of the extended digital signal of hydrogen nuclei. In some embodiments, the combined signal may be an IF signal of M+k bits.

FIG. 14 is a schematic diagram illustrating an exemplary receiver according to some embodiments of the present disclosure. Receiver 220 may include a receiving component 1401 and a sampling component 1402. Receiving component 1401 may receive an RF signal. In some embodiments, the RF signal may also be referred to as FID signal. In some embodiments, the RF signal may be an MR signal originating from hydrogen nuclei ($^1$H) and/or non-hydrogen nuclei (such as $^3$He, $^7$Li, $^{13}$C, $^{17}$O, $^{19}$F, $^{23}$Na, $^{31}$P, $^{129}$Xe, etc.). Receiving component 1401 may include a coil element 1403, an amplifier 1404, and a filter 1405. Coil element 1403 may be a receiver coil element that may induce an analog signal (for example, a voltage signal, a current signal, etc.) in response to the RF signal. Amplifier 1404 may be connected to coil element 1403 and increase the amplitude of the analog signal. In some embodiments, amplifier 1404 may be an LNA. Filter 1405 may perform filtration on the amplified signal to avoid aliasing during the analog-to-digital conversion in ADC 1410. In some embodiments, filter 1405 may be an anti-aliasing filter (AAF. In some embodiments, the AAF may include at least a band pass filter (BPF). The BPF may be an inductor capacitor filter (LC filter), a surface acoustic wave filter, or the like, or any combination thereof.

Sampling component 1402 may include electric circuits or electronic devices 1406 through 1419. Sampling components 1402 may sample the MR signal received by receiving component 1401 to generate an IF signal. Wide band RF gain block 1406 may further increase the amplitude of the analog signal before sending it to demultiplexer 1407.

Demultiplexer 1407 may include a plurality of switches. Filtration device 1408 may also include a plurality of filters. In some embodiments, the number of the filters may equal to that of the switches. Filtration device 1408 may be connected to demultiplexer 1407 such that each of the filters is connected to a switch. Demultiplexer 1407 may select a switch and send the MR signal to the filter connected to the switch. In some embodiments, the plurality of filters may be implemented in multiple data lines of the same number. Demultiplexer 1407 may select a switch and send the MR signal to the filter connected to the switch via the data line connected to the switch. In some embodiments, other electronic devices may be implemented in the data line, such as amplifiers, multipliers, etc. Each of the plurality of filters may have a specific pass band.

Demultiplexer 1407 may select a switch based on a default setting, an operation from a user, or a control signal provided by imaging system 110. In some embodiments, the control signal provided by imaging system 110 may be generated based on the center frequency and the bandwidth of the MR signal and the pass band of the filter. For example, Demultiplexer 1407 may select a switch when the center frequency of the MR signal falls within the pass band of the filter connected with the switch. The filter in filtration device 1408 may remove, from the MR signal, certain frequency components to avoid frequency domain aliasing. In some embodiments, the filter in filtration device 1408 may remove noise with certain frequency from the MR signal. For example, during the process for sampling of an MR signal of 64 MHz at a sampling rate of 100 MSPS, noise with the frequency of 136 MHz may be suppressed. In some embodiments, the filters in filtration device 1408 may be an AAF, a BPF, an LC filter, or the like.

Multiplexer 1409 may receive the filtered signal and forward it to pipelined ADC 1410. Multiplexer 1409 may also have a plurality of switches. In some embodiments, multiplexer 1409 may select a switch based on the control signal(s) provided by imaging system 110.

ADC 1410 may convert the analog MR signal to a digital signal. Clock synthesizer 1411 may connect to pipelined ADC 1410 and provide at least two sampling rates to pipelined ADC 1410. For example, clock synthesizer 1411 may receive a 600 MHz signal, and generate a sampling rate of 100 MSPS based on a factor of 6 and another sampling rate of 120 MSPS based on another factor of 5. In some embodiments, the factors may be set by a user via input/output 330, or determined by the imaging system 110. In some embodiments, the factor may be determined based at least partially on the frequency of the MR signal. Pipelined ADC 1410 may sample the MR signal at a sampling rate chosen from the at least two sampling rates. The sampling rate of pipelined ADC 1410 may be determined based on the frequency of the analog signal and/or the pass bands of the filters infiltration device 1408. For example, pipelined ADC 1410 may sample a 60 MHz signal with the sampling rate of 100 MSPS. In some embodiments, pipelined ADC 1410 may sample the MR signal with a band pass sampling technique. In some embodiments, clock synthesizer 1411 may include a PLL, a clock divider, etc.

The digital signal output by pipelined ADC 1410 may be demodulated into an I signal and a Q signal. In some embodiments, I/Q demodulation may be realized by NCO 1414, multipliers 1412 and 1413, and decimation low pass filters (decimation LPFs) 1415 and 1416. NCO 1414 may generate one or more periodical signals, such as a cosinusoid signal and a sinusoid signal. Multipliers 1412 and 1413 may multiply the MR signal with the cosinusoid signal and the sinusoid signal, respectively, to down mix the frequency of the MR signal. As used herein, down mix may refer to a shift operation that may move the frequency components of the MR signal towards the negative direction. The MR signal may be further processed by decimation filters 1415 and 1416. In some embodiments, decimation LPFs 1415 and 1416 may be low pass decimation filters. In some embodiments, decimation LPFs 1415 and 1416 may remove, from the non-hydrogen nuclei signal, negative frequency components and noise, and/or reduce the data rate to generate an IF signal.

In some embodiments, PLL 1419 may receive clock signal from clock synthesizer 1411. The received clock signal may be driven and distributed to decimation LPFs 1415 and 1416. Decimation LPFs 1415 and 1416 may receive the clock signal and adjust the sampling rate of the MR signal based on the clock signal. In some embodiments, a factor may be used to determine the sampling rate. The factor may be stored in RAM 1417. In some embodiments, RAM 1417 may further store the frequency, phase, or other related information of NCO 1414. In some embodiments, RAM 1417 may take the form of register 1020.

Post processor 1424 may receive the IF signal and further process the IF signal to generate a base band signal. In some embodiments, the based band signal may be sent to computing device 112 for further processing or image reconstruction. For instance, k-space data may be generated based on the base band signal before image reconstruction. In some embodiments, post processor 1424 may be omitted.

In some embodiments, logic information that controls the operation of the components in digital signal processing components 1421 may be stored in a flash 1423 or another nonvolatile logic device 1422. Digital signal processing components 1421 may acquire logic information from load interface 1418.

Figure 15:
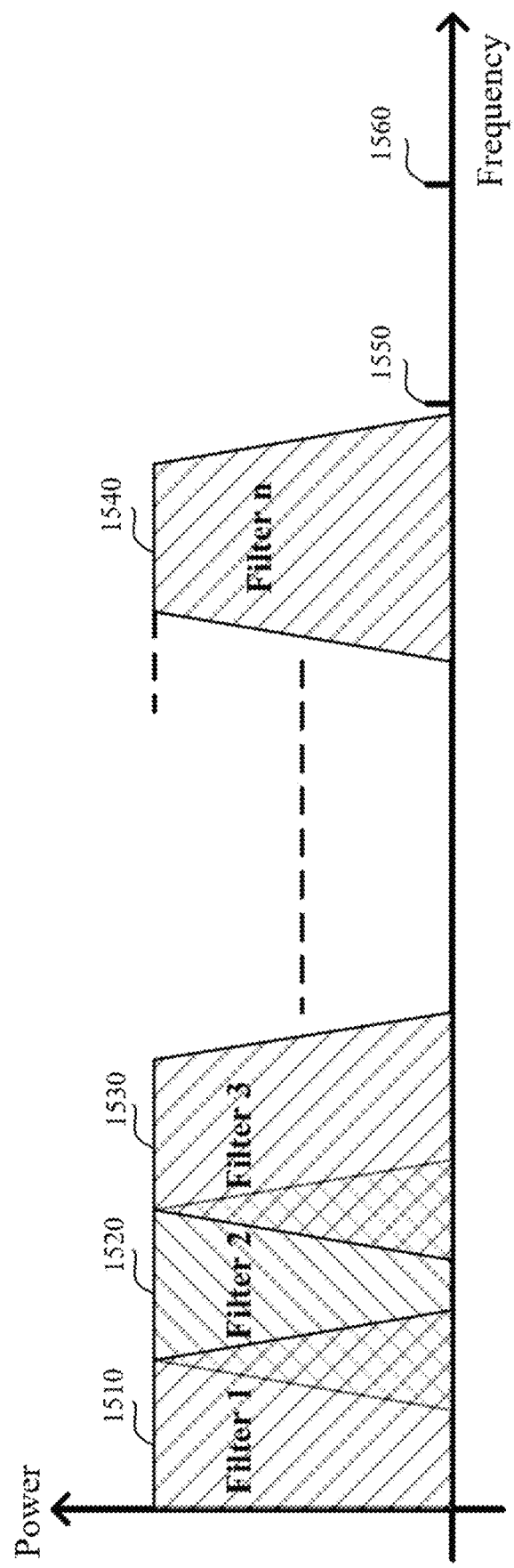
FIG. 15 is a schematic diagram illustrating an exemplary frequency spectrum of filtration device according to some embodiments of the present disclosure.

FIG. 15 is a schematic diagram illustrating an exemplary frequency spectrum of filtration device according to some embodiments of the present disclosure. Filtration device 730 may include a plurality of filters, such as filter 1, filter 2, . . . , filter n. Each of the plurality of filters, filter 1 through filter n, may have a pass band with a certain frequency range. In some embodiments, at least the pass bands of two filters may be different from each other. In some embodiments, at least the pass bands of two filters may be the same. Two pass bands are considered different if they are different in at least one feature including, e.g., the frequency range, pass band ripple, the rejection band suppression, the transition band width, etc. For instance, filter 1 may have a pass band in a trapezoid shape 1510, filter 2 may have a pass band in a trapezoid shape 1520, filter 3 may have a pass band in a trapezoid shape 1530, filter n may have a pass band in a trapezoid shape 1540.

Upper-limit 1550 may refer to the upper cut-off frequency of filtration device 730. In some embodiments, upper-limit 1550 may relate to the pass bands of the plurality of filters. For example, the upper cut-off frequency of filtration device 730 may equal to the highest upper cut-off frequency among all the filters including filter 1 through filter n. In some embodiments, upper-limit 1550 may be determined based on static magnetic field strength Bo. For example, when the magnetic field intensity Bo is 3 T, 5 T, 7 T, 9.4 T, or 14 T, the upper-limit 1550 may be 129 MHz, 215 MHz, 301 MHz, 404 MHz, and 600 MHz, respectively.

In some embodiments, there may be an overlapping area between two neighbor pass bands in frequency spectrum 1500. For example, the pass bands of filter 1 and filter 2 may have an overlapping area having a shape of triangle filled with outlined diamonds. In some embodiments, the overlapping areas between two pass bands may allow a continuous frequency range of filtration device 730. A continuous frequency spectrum may guarantee all available frequency components are included in the frequency spectrum of filtration device 730.

Pass band 1560 may correspond to the analog input bandwidth of ADC 740. Pass band 1560 may be greater than the pass band of filtration device 730. For example, if the pass band of filtration device 730 is 600 MHz (corresponds to a magnetic field of 14 T), the pass band of ADC 740 may support up to 650 MHz.

Figure 16:
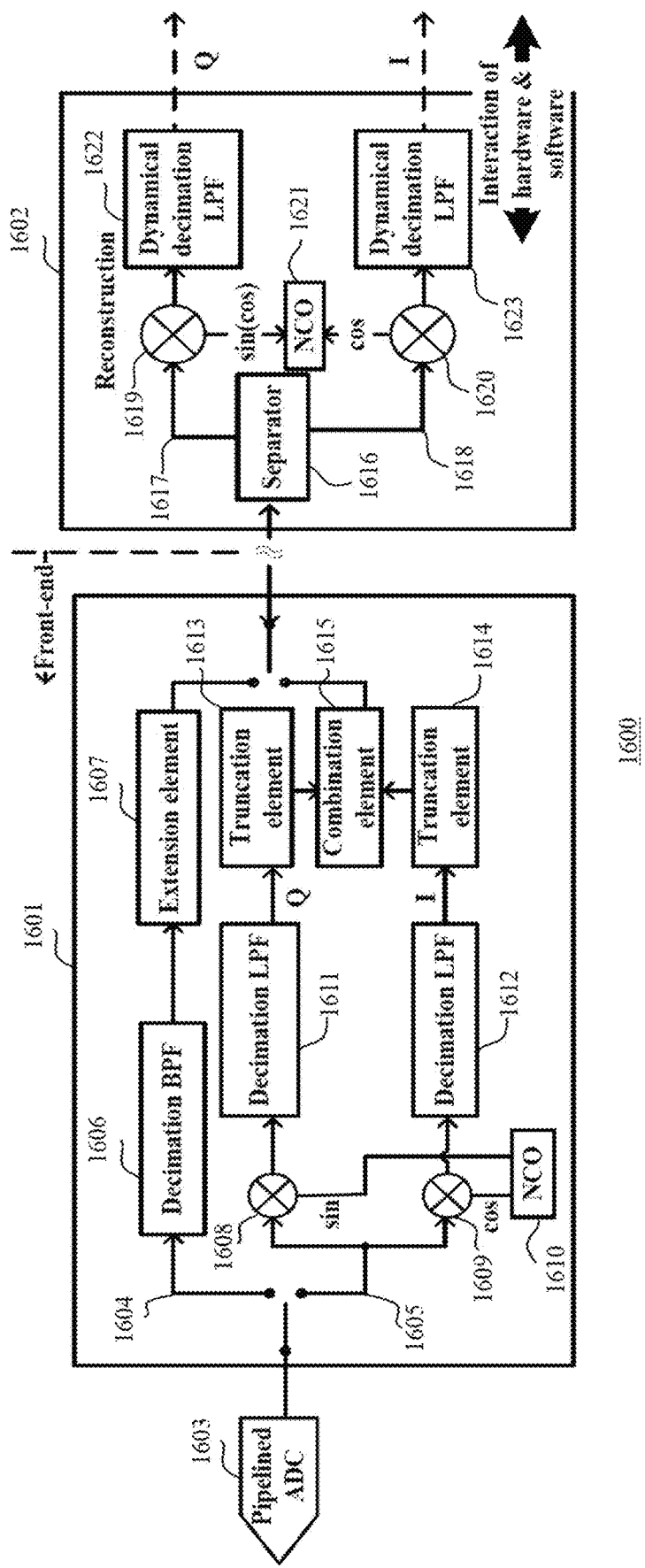
FIG. 16 is a schematic diagram illustrating an exemplary digital signal processing channel according to some embodiments of the present disclosure.

FIG. 16 is a schematic diagram illustrating an exemplary digital signal processing channel according to some embodiments of the present disclosure. Signal processing channel 1601 may connect to pipelined ADC 1603 and receive a digital signal. The digital signal may be a hydrogen nuclei signal or a signal originating from non-hydrogen nuclei. The hydrogen nuclei signal may refer to an MR signal from hydrogen nuclei ($^1$H). A non-hydrogen nuclei signal may refer to an MR signal from one or more species of-nuclei other than hydrogen (e.g., including at least two nucleus species selected from $^3$He, $^7$Li, $^{13}$C, $^{17}$O, $^{19}$F, $^{23}$Na, $^{31}$P, $^{129}$Xe, etc.). Signal processing channel 1601 may include an H channels 1604 and an X channel 1605. H channel 1604 may process a hydrogen nuclei signal. X channel 1605 may process a non-hydrogen nuclei signal.

In H channel 1604, the hydrogen nuclei signal may be processed by decimation band pass filter (decimation BPF) 1606. Decimation BPF 1606 may reduce the data rate as well as remove, from the hydrogen nuclei signal, some components (e.g., noise, interference frequency components). In some embodiments, decimation BPF 1606 may receive a clock signal from PLL 1419. The clock signal may be used to provide the working clock and may equal to the sampling rate of signals from hydrogen nuclei. In some embodiments, the processed hydrogen nuclei signal may be an IF signal. In some embodiments, the processed hydrogen nuclei signal may be a m bits (for example, 18 bits) value. In some embodiments, the hydrogen nuclei signal may be provided to extension element 1607. Extension element 1607 may extend the hydrogen nuclei signal from m bits to m+n bits. In some embodiments, the bit-width extension may be performed by, for example, adding zeros after the LSB of the hydrogen nuclei signal or adding signs before the MSB of the hydrogen nuclei signal, or a combination of both. In some embodiments, extension element 1607 may be implemented in register 1020. Channel 1604 may output an IF signal of m+n bit-width after the processing.

In X channel 1605, an I/Q demodulation may be performed. In some embodiments, the non-hydrogen nuclei signal may be duplicated such that the same non-hydrogen nuclei signal may be sent to two sub-channels (for example, I sub-channel and Q sub-channel) in X channel 1605. The I/Q demodulation may be performed by NCO 1610, multipliers 1608 and 1609, and decimation low pass filters (decimation LPFs) 1611 and 1612. NCO 1610 may generate one or more periodical signals, for example, a sinusoid signal and a cosinusoid signal. Multipliers 1608 and 1609 may multiply the non-hydrogen nuclei signal in the I sub-channel and Q sub-channel with the cosinusoid signal and the sinusoid signal, respectively. The non-hydrogen nuclei signal in the two sub-channels may be further processed by low pass decimation LPFs 1611 and 1612. In some embodiments, low pass decimation LPFs 1611 and 1612 may remove, from the digital signal, negative frequency components and noise, and/or reduce the data rate. After the I/Q demodulation, a Q signal and an I signal may be generated. In some embodiments, both the I signal and Q signal may be values with m bit-width. Truncation element 1613 and 1614 may truncate each of m bits I signal and m bits Q signal to (m+n)/2-bits. The truncated I signal of (m+n)/2 bits and the truncated Q signal of (m+n)/2 bits may be combined by combiner 1615 to provide an (m+n) bits non-hydrogen nuclei signal. In some embodiments, truncation element 1613, truncation element 1614, and combination element 1615 may be implemented in register 1030. Channel 1605 may output an IF signal of (m+n) bits after the processing.

Digital signal processing device 1600 may send the hydrogen nuclei signal and the non-hydrogen nuclei signal to reconstructor 1602. In some embodiment, both of the signals may be sent via a transmitting line of (m+n) bits. Reconstructor 1602 may restore the hydrogen nuclei signal and the non-hydrogen nuclei signal. In some embodiments, the restoration of the hydrogen nuclei signal and the non-hydrogen nuclei signal may be performed by a separator 1616, multipliers 1619 and 1620, an NCO 1621, and decimation filters 1622 and 1623. Separator 1616 may divide the input signal to two sub-channels 1617 and 1618. In some embodiments, the hydrogen nuclei signal may be duplicated such that the same hydrogen nuclei signal is sent to two sub-channels 1617 and 1618. The non-hydrogen nuclei signal, in a form of an I signal and a Q signal in signal processing channel 1605, is separated into the I signal and the Q signal by separator 1619. The I signal may be sent to sub-channel 1618, and the Q signal may be sent to sub-channel 1617. NCO 1621 may generate one or more periodical signals, for example, a sinusoid signal and a cosinusoid signal. The periodical signals may be multiplied, by multipliers 1619 and 1620, with the signals in sub-channels 1617 and 1618. In non-hydrogen nuclei cases, a sinusoid signal may be multiplied with the signal in both sub-channels 1617 and 1618. In hydrogen nuclei case, a sinusoid signal may be multiplied with the Q signal in sub-channel 1617 and a cosinusoid signal may be multiplied with the I signal in sub-channel 1618. Decimation filters 1622 and 1623 may be applied to reduce data rate and/or remove or reduce noise from sub-channels 1617 and 1618. After the restoration of the hydrogen nuclei signal or the non-hydrogen nuclei signal, k-space data may be generated in reconstructor 1602. In some embodiments, an image may be generated based on the k-space data. In some embodiments, a spectrum may be generated based on the k-space data. The spectrum may refer to a spectrum of the frequencies of the RF signal. The spectrum may be used for magnetic resonance spectroscopy analysis. In some embodiments, reconstructor 1602 may be implemented on image processing device 112.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "block,", "module,", "module", "unit,", "component," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution—e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate 20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A digital signal processing device comprising:
a first channel configured to process a first signal originating from a subject to obtain a first intermediate frequency (IF) signal with a first bit-width, wherein the first signal originates from hydrogen nuclei in the subject by a magnetic resonance imaging system, and the first channel further comprises:
a band pass decimation filter configured to process the first signal to obtain the first IF signal;
a second channel configured to process a second signal originating from the subject, wherein the second signal originates from non-hydrogen nuclei in the subject by the magnetic resonance imaging system, and the second channel includes:
an in-phase/quadrature (I/Q) demodulator configured to divide the second signal to obtain a third signal with a third bit-width and a fourth signal with a fourth bit-width, wherein the I/Q demodulator further includes at least one low pass decimation filter, the at least one low pass decimation filter being configured to perform the I/Q demodulation; and
a combination element configured to combine the third signal with the fourth signal to obtain a second IF signal with the first bit-width; and
a reconstructor configured to perform an image reconstruction based on the first IF signal and the second IF signal that are transmitted from the digital signal processing device.

2. The device of claim 1, wherein to process the first signal to obtain the first IF signal with the first bit-width, the first channel further comprising:
an extension element configured to extend the first bit-width from a fifth bit-width by adding one or more zeros after a least significant bit (LSB) of the first IF signal, or adding one or more signs before a most significant bit (MSB) of the first IF signal.

3. The device of claim 2, wherein each of the third bit-width and the fourth bit-width equals to a half of the first bit-width.

4. The device of claim 2, wherein the fifth bit-width is an actual available bit-width of the first IF signal.

5. The device of claim 2, wherein the extension element is implemented in a register.

6. The device of claim 1, wherein to divide the second signal to obtain the third signal with the third bit-width and the fourth signal with the fourth bit-width, the second channel further comprising:
a first truncation element configured to truncate a bit-width of the third signal into the third bit-width; and
a second truncation element configured to truncate a bit-width of the fourth signal into the fourth bit-width.

7. The device of claim 6, wherein to truncate the bit-width of the third signal into the third bit-width, the first truncation element is configured to:
remove a most significant bit (MSB) of the bit-width of the third signal.

8. The device of claim 6, wherein to truncate the bit-width of the fourth signal into the fourth bit-width, the second truncation element is configured to:
remove a most significant bit (MSB) of the bit-width of the fourth signal.

9. The device of claim 1, wherein the band pass decimation filter is configured to receive a clock signal from a phase-locked loop, and the clock signal is configured to provide a working clock and is equal to a sampling rate of the first signal originating from hydrogen nuclei.

10. The device of claim 1, wherein
the first channel and the second channel are connected to a pipelined ADC, the pipelined ADC being configured to receive filtered RF signals forwarded by a multiplexer, the multiplexer being provided together with a demultiplexer, and
the filtered RF signals are obtained by filtering RF signals using a filtration device, an upper cut-off frequency of the filtration device being determined based on a static magnetic field strength, the filtered RF signals including the first signal originates from hydrogen nuclei in the subject and the second signal originates from non-hydrogen nuclei in the subject.

11. The device of claim 10, wherein
the filtration device includes a plurality of filters configured as anti-aliasing filters (AAFs), and
the demultiplexer includes a plurality of switches and is configured to transmit, via a switch selected among the plurality of switches, the RF signals to a filter of the plurality of filters electrically connected to the demultiplexer, wherein the switch is selected based on a center frequency and a bandwidth of the RF signals and a pass band of the filter associates with the center frequency and the bandwidth of the RF signals, and the number of the plurality of filters is equal to the number of the plurality of switches of the demultiplexer.

12. The device of claim 1, wherein
the first channel is provided with an extension element configured to extend the first bit-width from a fifth bit-width by adding one or more zeros after a least significant bit (LSB) of the first IF signal, or adding one or more signs before a most significant bit (MSB) of the first IF signal, and
the second channel is provided with a first truncation element configured to truncate a bit-width of the third signal into the third bit-width and a second truncation element configured to truncate a bit-width of the fourth signal into the fourth bit-width, each of the third bit-width and the fourth bit-width being equal to a half of the first bit-width.

13. The device of claim 1, wherein the reconstructor includes a separator, and the reconstructor is further configured to restore the first IF signal and the second IF signal through the separator, wherein
the separator is configured to divide the first IF signal and the second IF signal to a first sub-channel and a second sub-channel,
the first IF signal is duplicated, the duplicated first IF signals are sent to the first sub-channel and the second sub-channel, respectively, and
the second IF signal is separated into an I signal and a Q signal, the I signal is sent into the first sub-channel, and the Q signal is sent into the second sub-channel.

14. The device of claim 13, wherein to restore the first IF signal and the second IF signal, the reconstructor further includes a numerically controller oscillator (NCO), a first decimation filter, and a second decimation filter, wherein
the NCO is configured to generate a sinusoid signal and a cosinusoid signal, wherein the sinusoid signal is multiplied with the duplicated first IF signals in the first sub-channel and the second sub-channel, the sinusoid signal is multiplied with the Q signal in the second sub-channel, and the cosinusoid signal is multiplied with the I signal in the first sub-channel,
the first decimation filter and the second decimation filter are configured to reduce data rate and remove noise from the first sub-channel and the second sub-channel, respectively, and
k-space data is generated in the reconstructor after the restoration of the first IF signal and the second IF signal.

15. A method implemented on a digital processing device, comprising:
- receiving a free induction decay (FID) signal;
- determining that the FID signal is a first signal originating from a first species of nuclei, wherein the first species of nuclei of the subject refers to hydrogen nuclei;
- in response to the determination that the FID signal is the first signal, processing, via a first channel, the first signal to obtain a first intermediate frequency (IF) signal with a first bit-width, wherein the first channel further comprises:
  - a band pass decimation filter configured to process the first signal to obtain the first IF signal;
- determining that the FID signal is a second signal originating from a second species of nuclei, wherein the second species of nuclei of the subject refers to non-hydrogen nuclei;
- in response to the determination that the FID signal is the second signal,
  - performing, via a second channel, an in-phase/quadrature (I/Q) demodulation for dividing the second signal to obtain a third signal with a third bit-width and a fourth signal with a fourth bit-width, wherein the second channel further includes at least one low pass decimation filter, the at least one low pass decimation filter being configured to perform the I/Q demodulation; and
  - combining, via the second channel, the third signal with the fourth signal to obtain a second IF signal with the first bit-width; and
- performing, via a reconstructor, an image reconstruction based on the first IF signal and the second IF signal that are transmitted from the digital signal processing device.

16. The method of claim 15, the processing the first signal comprising extending, via an extension element, the first signal from a fifth bit-width to the first bit-width.

17. The method of claim 16, the performing the image reconstruction based on the first IF signal and the second IF signal further comprising:
- generating k-space data based on the first IF signal or the second IF signal; and
- generating an image based on the k-space data.

18. The method of claim 17, further comprising:
- determining a spectrum of frequencies of the FID signal based on the k-space data.

19. The method of claim 16, wherein the extending the first signal from a fifth bit-width to the first bit-width includes:
- adding one or more zeros after the least significant bit (LSB) of the first IF signal; or
- adding one or more signs before the most significant bit (MSB) of the first IF signal.

20. The method of claim 15, wherein dividing the second signal to obtain the third signal with the third bit-width and the fourth signal with the fourth bit-width includes:
- truncating the bit-widths of the third signal and the fourth signal into the third bit-width and the fourth bit-width, respectively.

* * * * *